United States Patent
Yu et al.

(10) Patent No.: US 10,193,497 B2
(45) Date of Patent: Jan. 29, 2019

(54) ENHANCED BROADBAND OPERATION OF AN ACTIVE MIXER

(71) Applicant: QUALCOMM Incorporated, San Diego, CA (US)

(72) Inventors: Xinmin Yu, San Diego, CA (US); Timothy Donald Gathman, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/831,370

(22) Filed: Dec. 4, 2017

(65) Prior Publication Data
US 2018/0159474 A1 Jun. 7, 2018

Related U.S. Application Data

(60) Provisional application No. 62/430,774, filed on Dec. 6, 2016.

(51) Int. Cl.
*H03D 7/14* (2006.01)
*H04B 1/26* (2006.01)

(52) U.S. Cl.
CPC ........ *H03D 7/1491* (2013.01); *H03D 7/1425* (2013.01); *H03D 7/1441* (2013.01); *H03D 7/1458* (2013.01); *H04B 1/26* (2013.01); *H03B 2200/0062* (2013.01); *H03D 2200/0043* (2013.01)

(58) Field of Classification Search
CPC ...... H03D 7/00; H03D 7/1425; H03D 7/1441; H03D 2200/0043; H03B 2200/006; H03B 2200/0062
See application file for complete search history.

(56) References Cited

U.S. PATENT DOCUMENTS

| | | | |
|---|---|---|---|
| 5,379,457 A | * | 1/1995 | Nguyen ............... H03D 7/1425 327/113 |
| 6,057,714 A | | 5/2000 | Andrys et al. |
| 6,278,866 B1 | | 8/2001 | Elder et al. |
| 6,850,746 B1 | | 2/2005 | Lloyd et al. |

(Continued)

OTHER PUBLICATIONS

Goldfarb M., et al., "Even Harmonic Double-Balanced Active Mixer for Use in Direct Conversion Receivers", IEEE Journal of Solid-State Circuits, vol. 38, No. 10, Oct. 2003, pp. 1762-1766.

(Continued)

*Primary Examiner* — Duc M Nguyen
(74) *Attorney, Agent, or Firm* — Holland & Hart LLP/Qualcomm

(57) ABSTRACT

Methods, systems, and devices for wireless communication are described for enhanced broadband operation of an active mixer. In an example, an apparatus may include an active mixer that converts between radio frequency (RF) signals and intermediate frequency (IF) signals based at least in part on an alternating current (AC) local oscillator (LO) signal, wherein a direct current (DC) current generated within the active mixer is dependent in part on a bias voltage and the AC LO signal. The apparatus may include a mixer biasing circuit that generates the bias voltage for the active mixer, a magnitude of the bias voltage having an inverse relationship to an amplitude of the AC LO signal.

22 Claims, 15 Drawing Sheets

(56) References Cited

U.S. PATENT DOCUMENTS

| | | | |
|---|---|---|---|
| 7,356,317 B2* | 4/2008 | Xu | H03D 7/1441 330/259 |
| 8,971,835 B2 | 3/2015 | Dufrene et al. | |
| 2004/0097214 A1* | 5/2004 | Gard | H04B 1/30 455/323 |
| 2006/0014509 A1* | 1/2006 | Xu | H03D 7/1441 455/255 |
| 2006/0141976 A1* | 6/2006 | Rohde | H03D 7/1441 455/326 |
| 2009/0221259 A1* | 9/2009 | Shiramizu | H03D 7/1433 455/334 |
| 2011/0092178 A1* | 4/2011 | Wang | H03D 7/1441 455/326 |
| 2012/0264391 A1* | 10/2012 | Basaran | H03D 7/1441 455/341 |
| 2014/0184301 A1* | 7/2014 | Ro | H03D 7/1491 327/359 |
| 2014/0273905 A1* | 9/2014 | Manku | H04B 1/109 455/266 |
| 2014/0348218 A1* | 11/2014 | Goldblatt | H04L 25/03878 375/229 |
| 2017/0237441 A1* | 8/2017 | Peltonen | H03L 3/00 331/158 |

OTHER PUBLICATIONS

International Search Report and Written Opinion—PCT/US2017/064740—ISA/EPO—dated Mar. 16, 2018.

Parveg D., et al., "Wideband Millimeter-Wave Active and Passive Mixers in 28 nm Bulk CMOS Technology", 10th European Microwave Integrated Circuits Conference (EUMIC), EUMA, Sep. 7, 2015 (Sep. 7, 2015), pp. 116-119, XP032823203, DOI: 10.1109/EUMIC.2015.7345082 [retrieved on Dec. 2, 2015] the whole document.

Zeinolabedinzadeh S., et al., "An Improved Active Mixer for Millimeter-Wave Applications", First Conference on Millimeter-Wave and Terahertz Technologies (MMWATT), IEEE, Piscataway, NJ, USA, Dec. 29, 2009 (Dec. 29, 2009), pp. 40-44, XP031670954, ISBN: 978-1-4244-6807-2 the whole document.

* cited by examiner

ENHANCED BROADBAND OPERATION OF AN ACTIVE MIXER

CROSS REFERENCES

The present Application for Patent claims priority to U.S. Provisional Patent Application No. 62/430,774 by Yu, et al., entitled "Enhanced Broadband Operation of an Active Mixer," filed Dec. 6, 2016, assigned to the assignee hereof.

BACKGROUND

The following relates generally to wireless communication, and more specifically to techniques for enhanced broadband operation of an active mixer.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Wireless communication devices, such as a UE or base station, include one or more mixers. A mixer is a non-linear circuit that may be used to shift a signal from one frequency to another for transmission or signal processing. A mixer is a 3-port electronic circuit, where two of the ports are "input" ports and the other port is an "output" port. The mixer mixes the two input signals such that a frequency of the output signal is either the sum (or difference) of the frequencies of the input signals. A mixer may be used to upconvert signals to radio frequencies for transmission, and downconvert received signals from radio frequencies to lower frequencies for processing. Two types of mixers are passive mixers and active mixers. A passive mixer may use diodes and rely on the non-linear relation between voltage and current to generate the mixer output. In a passive mixer, however, the output signal is of lower power than the input signals. An active mixer may use an amplifying device (such as a transistor or vacuum tube) to increase the strength of the output signal. However, operating at high frequencies such as millimeter wave (mm-wave) frequencies constrains the type of mixer that can be used. Generating a square-wave local oscillator (LO) signal having a high-swing to drive a passive mixer is prohibitively power-hungry at mm-wave frequencies. In many instances, only an active mixer can tolerate a low-swing sinusoidal LO signal waveform and provide acceptable performance. As wireless communication techniques improve, conventional mixers do not provide adequate performance.

SUMMARY

The described techniques relate to improved methods, systems, devices, or apparatuses that support techniques for enhanced broadband operation of an active mixer. Generally, the described techniques provide for generating direct current (DC) electrical current in an active mixer that is substantially independent of the amplitude of an input local oscillator (LO) signal. Described examples include a mixer that provides substantially constant gain and linearity across a range of amplitudes for the LO signal. To achieve these benefits, a biasing circuit and a combining circuit are electrically coupled to a voltage-biased mixer core circuit. In some examples, the biasing circuit generates a bias voltage that has an inverse relationship to an amplitude of the LO signal. In an inverse relationship, the biasing circuit may increase the bias voltage when the amplitude of the LO signal decreases and decrease the bias voltage when the amplitude of the LO signal increases. In other examples, the biasing circuit may generate a bias voltage that has a direct relationship with the amplitude of the LO signal. In a direct relationship, the biasing circuit may increase the bias voltage when the amplitude of the LO signal increases and decrease the bias voltage when the amplitude of the LO signal decreases. The combiner circuit generates a biased LO signal that is a combination of the bias voltage and the LO signal. The biased LO signal is applied to inputs of switch circuits within the voltage-biased mixer core circuit. The DC electrical current generated through the active mixer is substantially independent of the amplitude of the input LO signal, resulting in an active mixer that provides substantially constant gain and linearity across a range of millimeter wave (mm-wave) frequencies.

An apparatus for wireless communication is described. The apparatus may include an active mixer and a mixer biasing circuit. The active mixer may be configured to convert between radio frequency (RF) signals and intermediate frequency (IF) signals based at least in part on an alternating current (AC) local oscillator (LO) signal, wherein a direct current (DC) current generated within the active mixer is dependent in part on a bias voltage and the AC LO signal. The mixer biasing circuit may be configured to generate the bias voltage for the active mixer, a magnitude of the bias voltage depending at least in part on an amplitude of the AC LO signal.

In some examples, the apparatus may include a combiner circuit configured to generate a biased LO signal for input to the active mixer, the biased LO signal being a composite of the bias voltage and the AC LO signal. In some examples, the AC LO signal has a frequency within a defined frequency range, and the amplitude of the AC LO signal varies over the defined frequency range. In some examples, the amplitude of the AC LO signal varies based at least in part on temperature, process corners at a specific frequency, or both.

In some examples, the mixer biasing circuit may include a current source configured to provide a reference electrical current, and a transconductance circuit configured to receive the reference electrical current and the AC LO signal. In some examples, the mixer biasing circuit may include a differential amplifier that includes a first input configured to receive a voltage of the transconductance circuit, a second input configured to receive a reference voltage, and an output configured to output the bias voltage. This particular mixer biasing circuit may utilize one or more n-channel metal-oxide semiconductor field-effect transistors (NMOS) in its configuration. In some examples, the biasing circuit generates a bias voltage that has an inverse relationship to an amplitude of the LO signal. In an inverse relationship, the biasing circuit may increase the bias voltage when the amplitude of the LO signal decreases and decrease the bias voltage when the amplitude of the LO signal increases. In some examples, the apparatus may include a differential drive circuit that includes the transconductance circuit and a second transconductance circuit, the second transconductance circuit configured to receive the reference electrical current, the differential drive circuit for respectively receiving differential inputs of the AC LO signal at the transconductance circuit and the second transconductance circuit. In some examples, the mixer biasing circuit may include a p-channel metal-oxide semiconductor field-effect (PMOS) transistor with a drain electrically connected to a current source and a differential amplifier, where the differential amplifier includes a first input electrically connected to a drain of the PMOS transistor, a second input for receiving a reference voltage, and an output for outputting the bias voltage. The mixer biasing circuit with the PMOS configuration may generate a bias voltage that has a direct relationship with the amplitude of the LO signal. In a direct relationship, the biasing circuit may increase the bias voltage when the amplitude of the LO signal increases and decrease the bias voltage when the amplitude of the LO signal decreases.

In some examples, the active mixer may be selected from the group consisting of a single-balanced active mixer, a double-balanced active mixer, or a single-transistor active mixer. In some examples, the active mixer may include a switch circuit configured to generate the DC current within the active mixer based at least in part on the bias voltage and the AC LO signal. In some examples, the active mixer may include an input to receive a signal for upconversion and upconvert the signal from a first intermediate frequency to a first radio frequency. In some examples, the active mixer may include an input to receive a signal for downconversion and downconvert the signal from a first radio frequency to a first intermediate frequency.

In some examples, the apparatus may include a feedback loop that causes the differential amplifier to inversely control the magnitude of the bias voltage with respect to the amplitude of the AC LO signal. In some examples, the apparatus may include a feedback loop that causes the differential amplifier to decrease the magnitude of the bias voltage when the amplitude of the AC LO signal increases and increase the magnitude of the bias voltage when the amplitude of the AC LO signal decreases. In such examples, the magnitude of the bias voltage may depend at least in part on the amplitude of the AC LO signal.

In some examples, the apparatus may include a feedback loop that causes the differential amplifier to create a direct relationship between the magnitude of the bias voltage and the amplitude of the AC LO signal. In some examples, the apparatus may include a feedback loop that causes the differential amplifier to increase the magnitude of the bias voltage when the amplitude of the AC LO signal increases and decrease the magnitude of the bias voltage when the amplitude of the AC LO signal decreases. In such examples, the magnitude of the bias voltage may depend at least in part on the amplitude of the AC LO signal.

An apparatus for wireless communication is described. The apparatus may include an active mixing means and a mixer biasing means. The active mixing means for converting between RF signals and IF signals based at least in part on an AC LO signal, wherein a DC current generated within the active mixing means is dependent in part on a bias voltage and the AC LO signal. The mixer biasing means for generating the bias voltage for the active mixing means, a magnitude of the bias voltage depending at least in part on an amplitude of the AC LO signal.

In some examples, the apparatus may include a combiner means for generating a biased LO signal for input to the active mixing means, the biased LO signal being a composite of the bias voltage and the AC LO signal. In some examples, the apparatus may include means for inversely controlling the magnitude of the bias voltage based at least in part on the amplitude of the AC LO signal. In some examples, the apparatus may include means for controlling the magnitude of the bias voltage based at least in part on a direct relationship with the amplitude of the AC LO signal.

In some examples, the active mixer means includes input means for receiving a signal for upconversion, the active mixer means for upconverting the signal from a first intermediate frequency to a first radio frequency. In some examples, the active mixer means includes input means for receiving a signal for downconversion, the active mixer means for downconverting the signal from a first radio frequency to a first intermediate frequency.

A method of wireless communication is described. The method may include generating a bias voltage with a magnitude that depends at least in part on an AC LO signal, generating a DC current within an active mixer, wherein the generated DC current is dependent on the bias voltage and the AC LO signal, and converting, by the active mixer, a signal between a radio frequency and an intermediate frequency based at least in part on the AC LO signal.

An apparatus for wireless communication is described. The apparatus may include means for generating a bias voltage with a magnitude that depends at least in part on an amplitude of an AC LO signal, means for generating a DC current within an active mixer, wherein the generated DC current is dependent on the bias voltage and the AC LO signal, and means for converting, by the active mixer, a signal between a radio frequency and an intermediate frequency based at least in part on the AC LO signal.

Another apparatus for wireless communication is described. The apparatus may include a processor, memory in electronic communication with the processor, and instructions stored in the memory. The instructions may be operable to cause the processor to generate a bias voltage with a magnitude that depends at least in part on an amplitude of an AC LO signal, generate a DC current within an active mixer, wherein the generated DC current is dependent on the bias voltage and the AC LO signal, and convert, by the active mixer, a signal between a radio frequency and an intermediate frequency based at least in part on the AC LO signal.

A non-transitory computer readable medium for wireless communication is described. The non-transitory computer-readable medium may include instructions operable to cause a processor to generate a bias voltage with a magnitude that depends at least in part on an amplitude of an AC LO signal, generate a DC current within an active mixer, wherein the generated DC current is dependent on the bias voltage and the AC LO signal, and convert, by the active mixer, a signal between a radio frequency and an intermediate frequency based at least in part on the AC LO signal.

Some examples of the method, apparatus, and non-transitory computer-readable medium described above may further include processes, features, means, or instructions for inversely controlling the magnitude of the bias voltage based at least in part on the amplitude of the AC LO signal. Some examples of the method, apparatus, and non-transitory computer-readable medium described above may further include processes, features, means, or instructions for controlling the magnitude of the bias voltage based at least in part on a direct relationship with the amplitude of the AC LO signal. In some examples of the method, apparatus, and non-transitory computer-readable medium described above, converting the signal between the radio frequency and the intermediate frequency comprises upconverting the signal from the intermediate frequency to the radio frequency.

In some examples of the method, apparatus, and non-transitory computer-readable medium described above, converting the signal between the radio frequency and the intermediate frequency comprises downconverting the signal from the radio frequency to the intermediate frequency. Some examples of the method, apparatus, and non-transitory computer-readable medium described above may further include processes, features, means, or instructions for generating a biased LO signal for input to the active mixer, the biased LO signal being a composite of the bias voltage and the AC LO signal.

DETAILED DESCRIPTION

Figure 1:
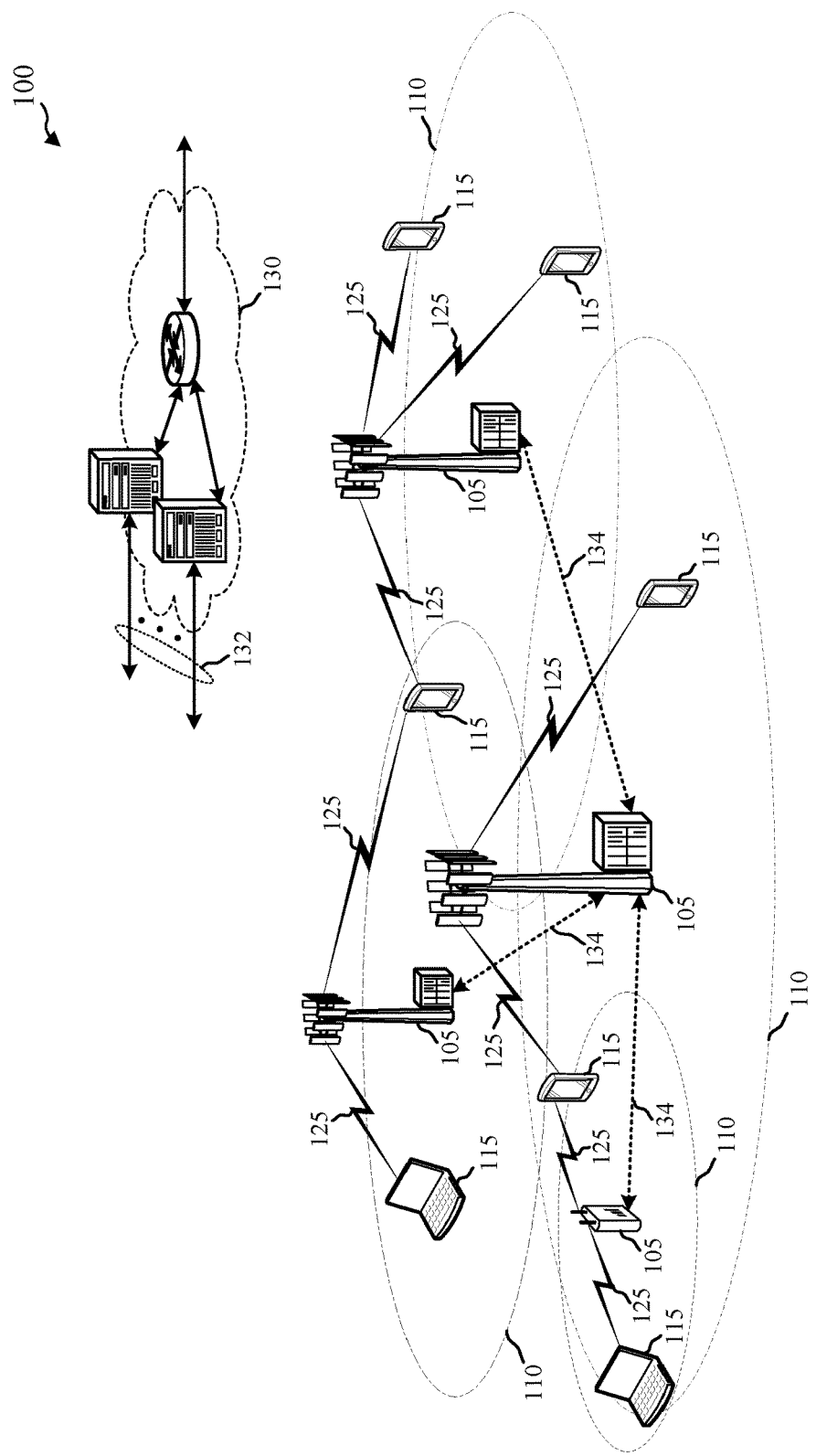
FIG. 1 illustrates an example of a system for wireless communication that supports techniques for enhanced broadband operation of an active mixer in accordance with aspects of the present disclosure.

The described techniques relate to improved methods, systems, devices, or apparatuses that support techniques for enhanced broadband operation of an active mixer. Generally, the described techniques provide for generating direct current (DC) electrical current in an active mixer that is substantially independent of the amplitude of an input local oscillator (LO) signal. In an example, a mixer biasing circuit may generate a bias voltage for an active mixer, a magnitude of the bias voltage depending at least in part on an amplitude of the AC LO signal. An active mixer in the described examples may provide substantially constant gain and linearity across a range of amplitudes for the LO signal.

Some active mixers have issues with linearity and not all types of active mixers may be used at mm-wave frequencies. A double balanced Gilbert mixer, for example, includes two switch devices with a transconductance (gm) device electrically coupled to each switch device, and a radio frequency (RF) signal may be input at each gm device. The switch devices and the gm device may include one or more metal-oxide semiconductor field-effect transistors (MOSFETs), and the gm device may be electrically coupled to a respective source terminal of each switch device. Coupling a gm device to a source terminal of a switch device, however, introduces unacceptable non-linearity at mm-wave frequencies.

A conventional modification is to remove the gm devices and instead use a transformer for coupling the RF signal directly to the switch devices. The conventional modification adds a tail current source to maintain constant DC electrical current within the double balanced Gilbert mixer such that the electrical current, gain, and linearity of the mixer is not strongly dependent on the amplitude of the LO signal. The amplitude of the LO signal may vary due to one or more factors, such as the frequency range over which the mixer is used, ambient temperature, process corners at a specific frequency, and the like.

However, use of the tail current source affects linearity of such a mixer due to high impedance of the tail current source at low frequencies. Specifically, a low-frequency second order intermodulation (IM2) component generated at a source terminal of a switch device degrades a third order intercept (IP3) of such a mixer. If the tail current source is removed in favor of a current mirror bias for the gate of the switch devices, IP3 can be further improved. However, the direct current (DC) electrical current in the active Gilbert mixer becomes a strong function of LO amplitude due to the switch device being implemented using MOSFETs, bipolar junction transistors (BJTs), or the like. MOSFETs and BJTs are nonlinear devices and hence generate DC current from a sine-wave (e.g., the LO signal) applied at a gate terminal of the MOSFET or a base terminal of the BJT. Thus, conventional mixer arrangements are unable to provide sufficient constant gain and linearity at mm-wave frequencies.

The techniques described herein remedy the problems in conventional active mixer arrangements. The examples described herein may generate DC electrical current for an active mixer that is substantially independent of the amplitude of an input LO signal, resulting in an active mixer that provides substantially constant gain and linearity across a range of millimeter wave (mm-wave) frequencies. To achieve these benefits, a biasing circuit and a combiner circuit are electrically coupled to a mixer core circuit. The biasing circuit may generate a magnitude of the bias voltage that has an inverse relationship to an amplitude of the LO signal. The biasing circuit may also generate a magnitude of the bias voltage that has a direct relationship to an amplitude of the LO signal. The combiner circuit generates a biased LO signal that is a combination of the bias voltage and the LO signal. The biased LO signal is applied to inputs of switch circuits within the mixer core circuit. The switch circuits within the mixer core circuit generate DC electrical current generated through the active mixer that is substantially independent of the amplitude of the input LO signal.

Aspects of the disclosure are initially described in the context of a wireless communications system. Techniques are described for enhanced broadband operation of an active mixer that is substantially independent of the amplitude of a LO signal. Aspects of the disclosure are further illustrated by and described with reference to apparatus diagrams, system diagrams, and flowcharts that relate to techniques for enhanced broadband operation of an active mixer.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a LTE (or LTE-Advanced) network, or a New Radio (NR) network. In some cases, wireless communications system 100 may support enhanced broadband communications, ultra-reliable (i.e., mission critical) communications, low latency communications, and communications with low-cost and low-complexity devices. The base stations 105, UEs 115, or both, as well as other devices that communicate wirelessly, each may include one or more active mixers. The active mixer may include a mixer core circuit that is electrically coupled to a mixer biasing circuit and a combiner circuit. The mixer biasing circuit may generate a bias voltage (e.g., a DC voltage) with a magnitude that has an inverse relationship to an amplitude of the LO signal. For example, in an NMOS implementation, the mixer biasing circuit may increase the magnitude of the bias voltage when the amplitude of the AC LO signal decreases, and may decrease the magnitude of the bias voltage when the amplitude of the AC LO signal increases. The mixer biasing circuit may also generate a bias voltage with a magnitude that has a direct relationship to an amplitude of the LO signal. For example, in a PMOS implementation, the mixer biasing circuit may increase a magnitude of a bias voltage when an amplitude of the AC LO signal increases, and may decrease the magnitude of the bias voltage when the amplitude of the AC LO signal decreases. The combiner circuit may generate a biased LO signal that is a combination of the bias voltage and the LO signal. The combiner circuit may apply the biased LO signal to inputs of switch circuits within the mixer core circuit to generate DC electrical current within the mixer that is substantially independent of the amplitude of an input LO signal.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Wireless communications system 100 may operate in an ultra-high frequency (UHF) frequency region using frequency bands from 700 MHz to 2600 MHz (2.6 GHz), although in some cases WLAN networks may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mm-wave) communications between UEs 115 and base stations 105. Devices operating in mm-wave or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g. a base station 105) to shape and/or steer an overall antenna beam in the direction of a target receiver (e.g. a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g. a base station) and a receiver (e.g. a UE), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mm-wave receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

The techniques described herein remedy the problems in conventional active mixer arrangements. A wireless communication device, such as UE 115, base station 105, and the like, each may include one or more active mixers. The active mixer may include a mixer core circuit that is electrically coupled to a mixer biasing circuit and a combiner circuit. The mixer biasing circuit and the combiner circuit may be part of the active mixer, or may be separate circuitry. The biasing circuit may generate a bias voltage with a magnitude that has an inverse relationship to an amplitude of the LO signal. The biasing circuit may also generate a bias voltage with a magnitude that has a direct relationship to an amplitude of the LO signal. The combiner circuit may generate a biased LO signal that is a combination of a bias voltage and the LO signal. The biased LO signal is applied to inputs of switch circuits within the mixer core circuit to generate DC electrical current within the mixer core circuit that is substantially independent of the amplitude of the input LO signal. Because of this independence, the mixer core circuit as described herein has improved gain and linearity across a range of mm-wave frequencies as compared to conventional mixers.

Figure 2:
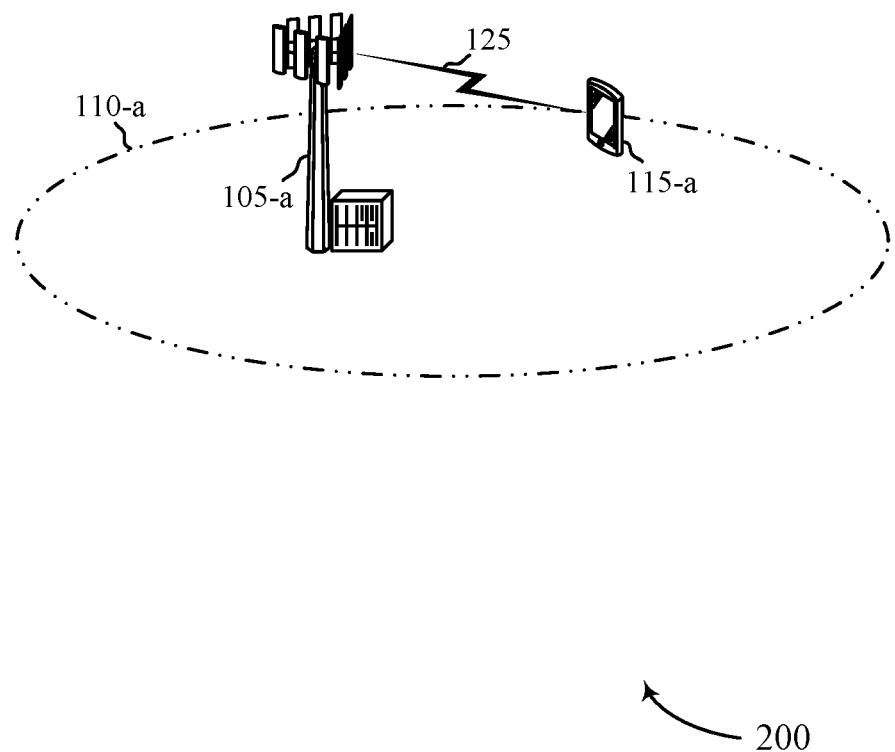
FIG. 2 illustrates an example of a wireless communication system that supports techniques for enhanced broadband operation of an active mixer in accordance with aspects of the present disclosure.

FIG. 2 illustrates an example of a wireless communications system 200 for enhanced broadband operation of an active mixer. Wireless communications system 200 may include a base station 105-*a* having a coverage area 110-*a*, and UE 115-*a* may communicate with base station 105-*a* via communication link 125. Base station 105-*a* is an example of base station 105, and UE 115-*a* is an example of UE 115 of FIG. 1. Base station 105-*a* and UE 115-*a* each may include one or more active mixers for upconverting signals to mm-wave frequencies for transmission over a wireless medium, and for downconverting signals received over the wireless medium from mm-wave frequencies to a lower frequency (e.g., an intermediate frequency (IF), etc.) for processing. Devices other than base station 105-*a* and UE 115-*a* may also include an active mixer as described herein.

Figure 3:
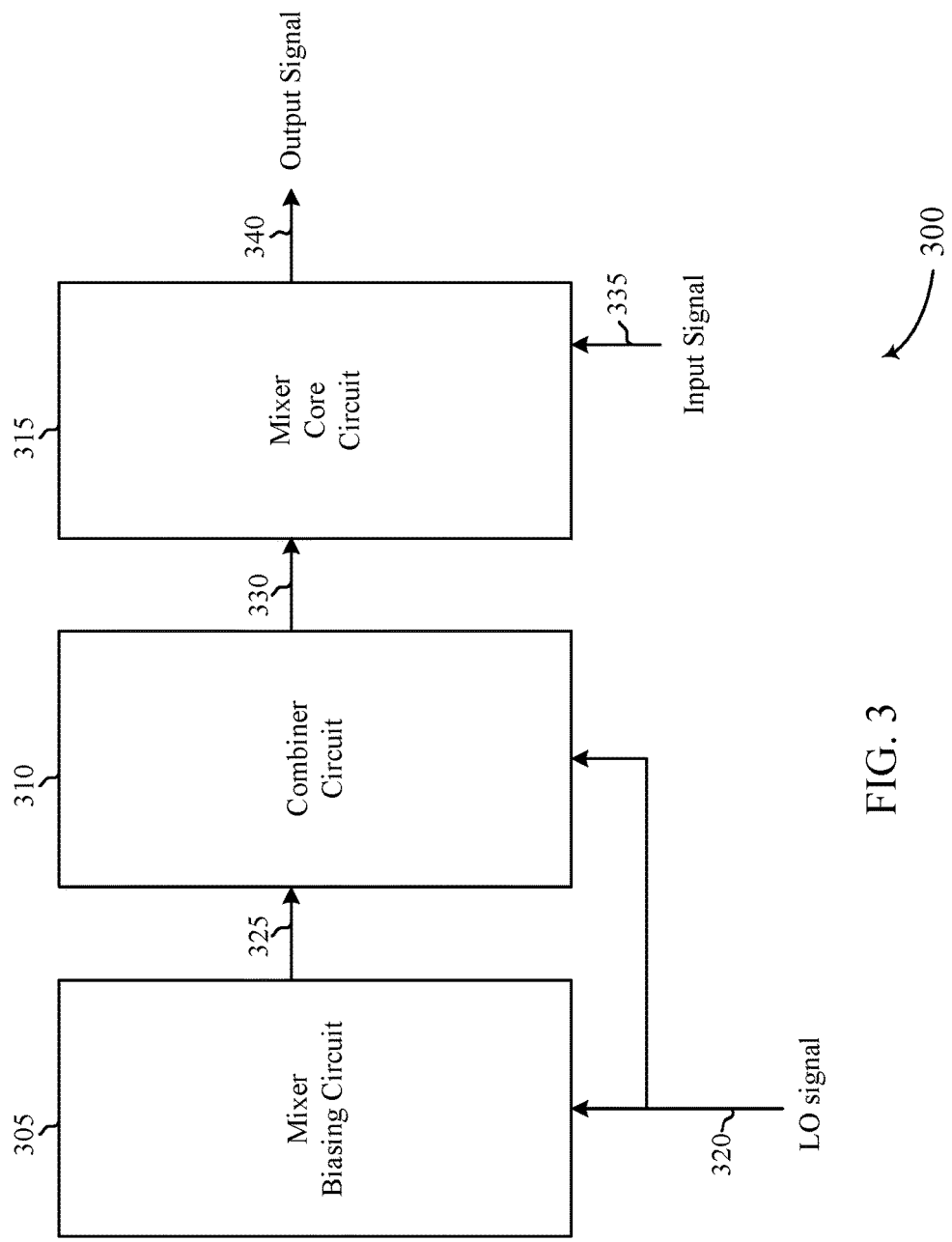
FIG. 3 illustrates an example block diagram that supports techniques for enhanced broadband operation of an active mixer in accordance with aspects of the present disclosure.

FIG. 3 illustrates an example of a circuit block diagram 300 of an active mixer for enhanced broadband operation of an active mixer. The circuit block diagram 300 for an active mixer may include a mixer biasing circuit 305, a combiner circuit 310, and a voltage-biased mixer core circuit 315. The mixer biasing circuit 305 may have an input to receive a LO signal 320 and generate a bias voltage 325 for output to the combiner circuit 310. The LO signal 320 may be an alternating current (AC) waveform, such as a sine wave, oscillating at a particular frequency. An oscillator circuit, such as a voltage controlled oscillator (VCO), voltage controlled crystal oscillator (VCXO), or phase-locked loop (PLL) may be used to generate the LO signal 320. At higher frequencies such as mm-wave frequencies, the oscillator circuit may employ low voltage swing logic circuits such as current mode logic (CML).

The combiner circuit 310 may have an input to receive the LO signal 320 and the bias voltage 325, and output a biased LO signal 330. The voltage-biased mixer core circuit 315 may have an input to receive the biased LO signal 330 and an input signal 335, and output an output signal 340. In some examples, the mixer core circuit 315 may perform upconversion on the input signal 335 to generate the output signal 340 that has a higher frequency (e.g., upconvert from an intermediate frequency to a radio frequency). In other examples, the mixer core circuit 315 may perform downconversion on the input signal 335 to generate the output signal 340 that has a lower frequency (e.g., downconvert from a radio frequency to an intermediate frequency). As described herein, an intermediate frequency may be a frequency lower than a radio frequency (e.g., a mm-wave frequency) and may include baseband frequencies.

Figure 4:
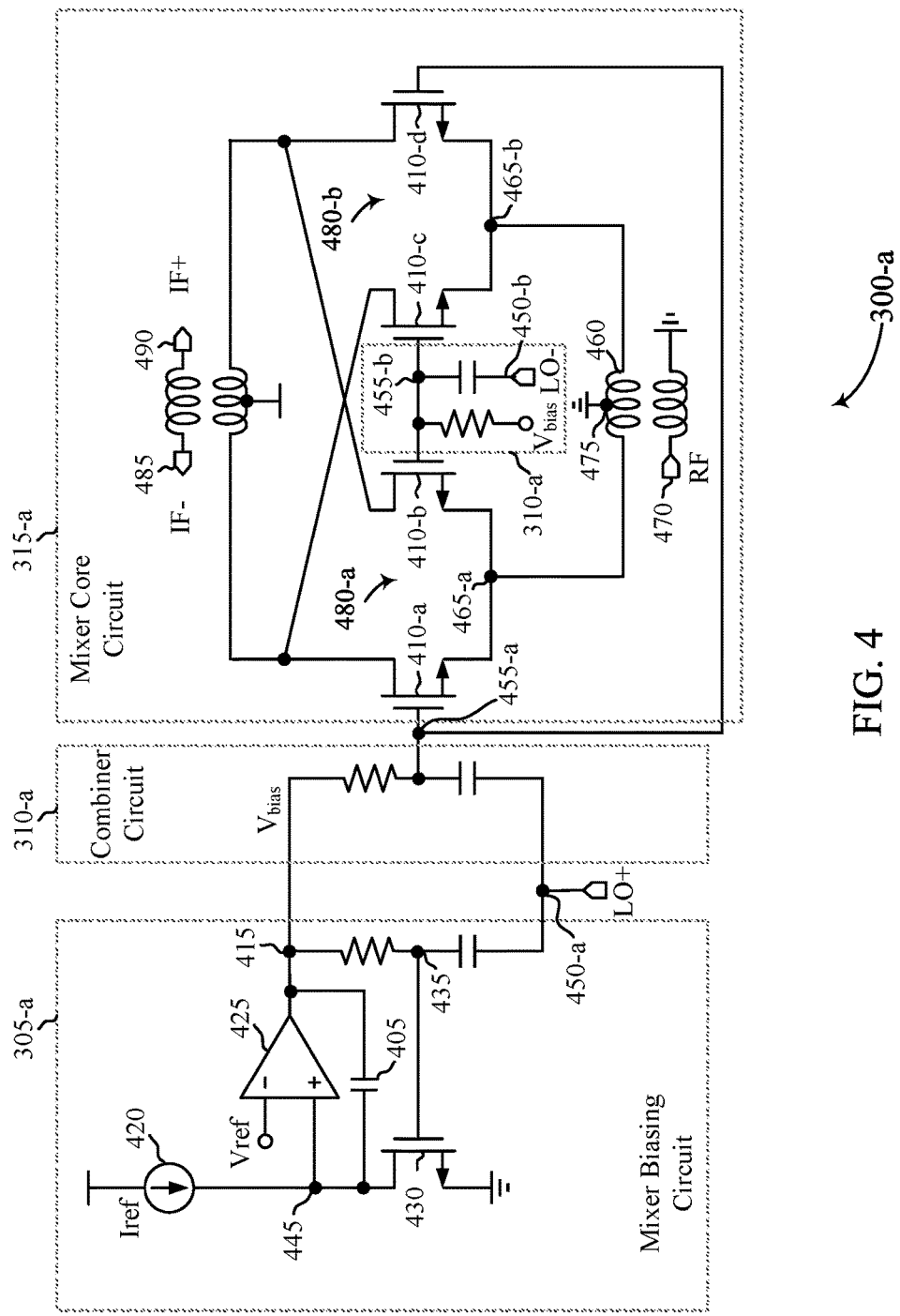
FIG. 4 illustrates an example circuit diagram that supports techniques for enhanced broadband operation of an active mixer in accordance with aspects of the present disclosure.
Figure 5:
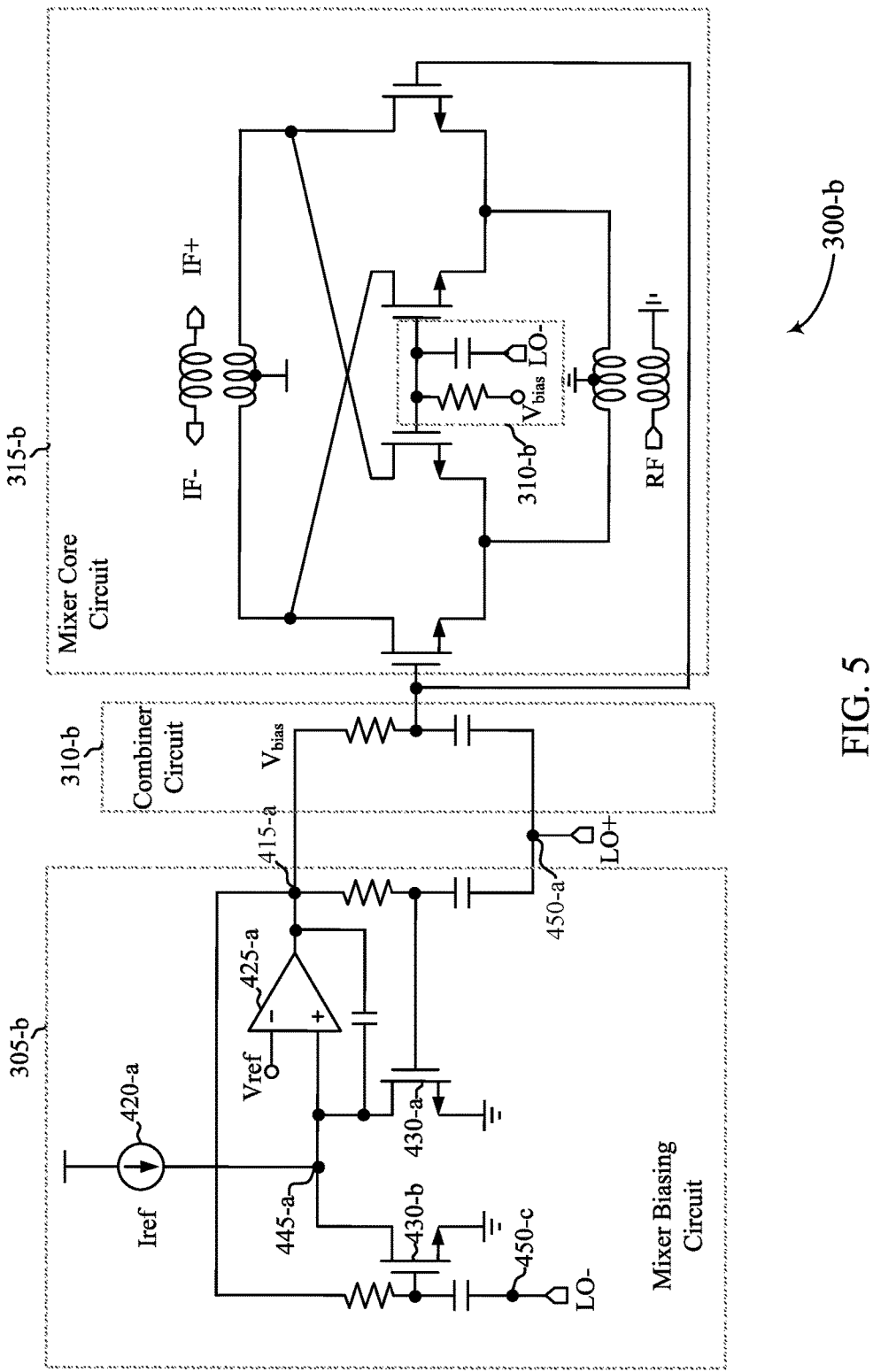
FIG. 5 illustrates an example circuit diagram that supports techniques for enhanced broadband operation of an active mixer in accordance with aspects of the present disclosure.

The mixer biasing circuit 305 may account for variations in the amplitude of the LO signal 320. Temperature, frequency, and process corners may impact the amplitude of the LO signal. For example, voltage-biased mixer core circuit 315 may operate over a large frequency range (e.g., from 28 GHz to 40 GHz), and due to circuitry limitations, the amplitude of the LO signal 320 may vary over the frequency range. For example, the peak amplitude of the LO signal 320 at 28 GHz may be 800 millivolts (mV) and the peak amplitude of the LO signal 320 at 40 GHz may be 300 mV. To prevent variations in the amplitude of the LO signal from negatively affecting the output signal 340, the mixer biasing circuit 305 may generate a bias voltage 325 with a magnitude that has an inverse relationship or a direct relationship to the amplitude of the LO signal 320. The inverse relationship or the direct relationship may be linear, non-linear, logarithmic, exponential, or the like. A linear relationship may correspond to a specific factor between a change in the amplitude (e.g., peak-to-peak, root mean square (RMS), etc.) of the LO signal 320 and a change in the bias voltage 325 (e.g., −0.5×, −0.75×, −1×, −1.25×, −1.5×, etc.). The inverse relationship or the direct relationship may be used for the bias voltage 325 to offset an increase or decrease in the amplitude of the LO signal 320. For example, the mixer biasing circuit 305 may detect a change in amplitude (e.g., peak-to-peak voltage, RMS voltage, etc.) of the LO signal 320 and generate an opposite change in a voltage level of the bias voltage 325, such that the effect of the change in amplitude of the LO signal 320 on the DC electrical current generated through the voltage-biased mixer core circuit 315 is offset by the effect of the corresponding change in the bias voltage 325. In effect, the mixer biasing circuit 305 may adjust the bias voltage 325 accordingly based on the amplitude of the LO signal 320. Thus, the DC electrical current generated through the voltage-biased mixer core circuit 315 may be substantially independent of the amplitude of the input LO signal, resulting in an active mixer that provides substantially constant gain and linearity across a range of mm-wave frequencies. Circuit diagrams for the mixer biasing circuit 305, the combiner circuit 310, and the voltage-biased mixer core circuit 315 are described below. FIGS. 4 and 5 may represent a circuit diagram utilizing one or more NMOS transistors in its implementation and FIG. 6 may represent a circuit diagram utilizing one or more PMOS transistors in its implementation.

FIG. 4 illustrates an example circuit diagram 300-a for enhanced broadband operation of an active mixer. Depicted are circuit elements of a mixer biasing circuit 305-a, a combiner circuit 310-a, and a voltage-biased mixer core circuit 315-a, which respectively are examples of the mixer biasing circuit 305, the combiner circuit 310, and the voltage-biased mixer core circuit 315 of FIG. 3.

The mixer biasing circuit 305-a may include a current source 420, a differential amplifier 425, and a transconductance circuit 430. The transconductance circuit 430 may comprise of one or more NMOS transistors. In some examples, the differential amplifier 425 may be an operational amplifier, a single-stage operational transconductance amplifier (OTA), or the like. The transconductance circuit 430 may be a field effect transistor (FET), a MOSFET, a bipolar junction transistor (BJT), or other type of transistor. The current source 420 may output a reference electrical current Iref to provide a fixed amount of electrical current. The reference electrical current may be a bandgap current, a constant current, a proportional to absolute temperature (PTAT) current, a temperature-dependent current, or the like. The LO signal may be a sine wave or other alternating current signal and may be input at node 450. The node 450 may be electrically coupled to node 435, and node 435 may be electrically coupled to an input of the transconductance circuit 430. The transconductance circuit 430 may control the flow of electrical current therethrough based at least in part on the signal at node 435.

The differential amplifier 425 may have a first input to receive a reference voltage (Vref) and a second input to receive a voltage at node 445 for comparison to Vref. The differential amplifier 425 may generate, at node 415, the bias voltage based at least in part on a difference between the voltage Vref and the voltage at node 445. In some examples, a capacitor 405 may be coupled between node 415 and node 445 to provide a Miller compensation effect.

Nodes 415, 435, and 445 may form a feedback loop for the differential amplifier 425. The feedback loop may cause the differential amplifier 425 to output a bias voltage Vbias with a magnitude that has an inverse relationship to an amplitude of the LO signal received at node 450-a. Current source 420 may force a fixed electrical current into transconductance circuit 430 and has a large output resistance (e.g., theoretically an infinite output resistance). Because of the fixed current and large output resistance, an increase in AC voltage amplitude at 450-a leads to a decrease in voltage at node 445 causing the feedback loop through the differential amplifier 425 to decrease Vbias trying to maintain the voltage at node 445 the same as Vref. Conversely, a decrease in AC voltage amplitude at node 450-a leads to an increase in voltage at node 445 causing the feedback loop through the differential amplifier 425 to increase Vbias trying to maintain the voltage at node 445 the same as Vref.

The combiner circuit 310-a may be electrically coupled to node 415 to receive the bias voltage Vbias and to node 450 to receive the LO signal. In the depicted example, the LO signal 320 may be differentially input with LO+ at node 450-a and LO− at node 450-b, each representing the differential inputs. The combiner circuit 310-a may output a biased LO signal at node 455-a to one or more switch circuits of the voltage-biased mixer core circuit 315-a. Node 455-a may be electrically coupled to inputs of switch circuits 410-a and 410-d (e.g., via respective gate terminals of MOSFETs, respective base terminals of BJTs, or the like), and node 455-b may be electrically coupled to inputs of switch circuits 410-b and 410-c. The biased LO signal may be a composite of the DC voltage Vbias and the AC LO signal.

The voltage-biased mixer core circuit 315-a shown in FIG. 4 is in a double-balanced active mixer arrangement having a transformer 460 with a node 470 for an input signal (e.g., a RF signal), and differential nodes 485 and 490 for output of a differential output signal (e.g., intermediate frequency signals IF+ and IF−). The RF signal may be within a mm-wave frequency band. For downconversion, voltage-biased mixer core circuit 315-a may receive an RF input signal at node 470 and output a downconverted signal at nodes 485 and 490. For upconversion, voltage-biased mixer core circuit 315-a may receive an intermediate frequency input signal at node 470 and output an RF signal at nodes 485 and 490.

The DC voltage Vbias of the biased LO signal input at node 455 at the switch circuits 410-a, 410-b, 410-c, and 410-d of the voltage-biased mixer core circuit 315-a may cause these switch circuits to operate at a DC current through transformer 460 that is independent of the amplitude of the LO signal. As depicted, transformer 460 is electrically coupled to pairs of the switch circuits 410. At node 465-a, transformer 460 is electrically coupled to respective inputs of switch circuits 410-a and 410-b that form a first switching pair 480-a, and, at node 465-b, transformer 460 is electrically coupled to respective inputs of switch circuits 410-c and 410-d that form a second switching pair 480-b. Transformer 460 is also coupled to ground at node 475, instead of being connected to a tail current source as in conventional solutions.

In this configuration, in order to maintain a constant total DC bias current generated in voltage-biased mixer core circuit 315-a, Vbias may have an inverse relationship with the LO signal amplitude that scales with changes in the LO signal amplitude. In an example, Vbias may increase when the LO signal amplitude decreases, and decrease when LO signal amplitude increases. Beneficially, the DC electrical current generated in the voltage-biased mixer core circuit 315-a is substantially independent of the amplitude of the LO signal, thereby enabling the voltage-biased mixer core circuit 315-a to simultaneously provide constant gain and improved linearity across a range of mm-wave frequencies.

The mixer biasing circuit 305 may be configured in other arrangements that achieve these same benefits. FIG. 5 illustrates an example circuit diagram 300-b of an active mixer for enhanced broadband operation of an active mixer. The example circuit diagram 300-b may include a mixer biasing circuit 305-b that is an example of the mixer biasing circuits 305 and 305-a, as described in FIGS. 3 and 4. The circuit elements shown in FIG. 5 that are the same as those shown in FIG. 4 perform the same functions as described in FIG. 4 and their description is not repeated here.

In this example, the mixer biasing circuit 305-b may include a differential drive circuit to equally, or substantially equally, split loading capacitance on LO+ and LO− across multiple transconductance circuits. In FIG. 5, the mixer biasing circuit 305-b may include a differential drive circuit that includes multiple transconductance circuits 430-a and 430-b, whereas the mixer biasing circuit 305-a of FIG. 4 includes only a single transconductance circuit 430. The LO signal may be differentially input to the transconductance circuits 430-*a* and 430-*b*, with LO+ input at node 450-*a* and LO− input at node 450-*c*. In the depicted example, the current source 420-*a* may output a reference electrical current Iref. The differential amplifier 425-*a* may compare the voltage at the node 445-*a* to the reference voltage Vref received at its other input. The differential amplifier 425-*a* may output the bias voltage Vbias at node 415-*a* to the combiner circuit 310-*b* for use by the voltage-biased mixer core circuit 315-*b* in a similar manner as described above. At the expense of the additional transconductance circuit 430-*b*, mixer biasing circuit 305-*b* may split loading capacitance on LO+ and LO− equally, or substantially equally.

Figure 6:
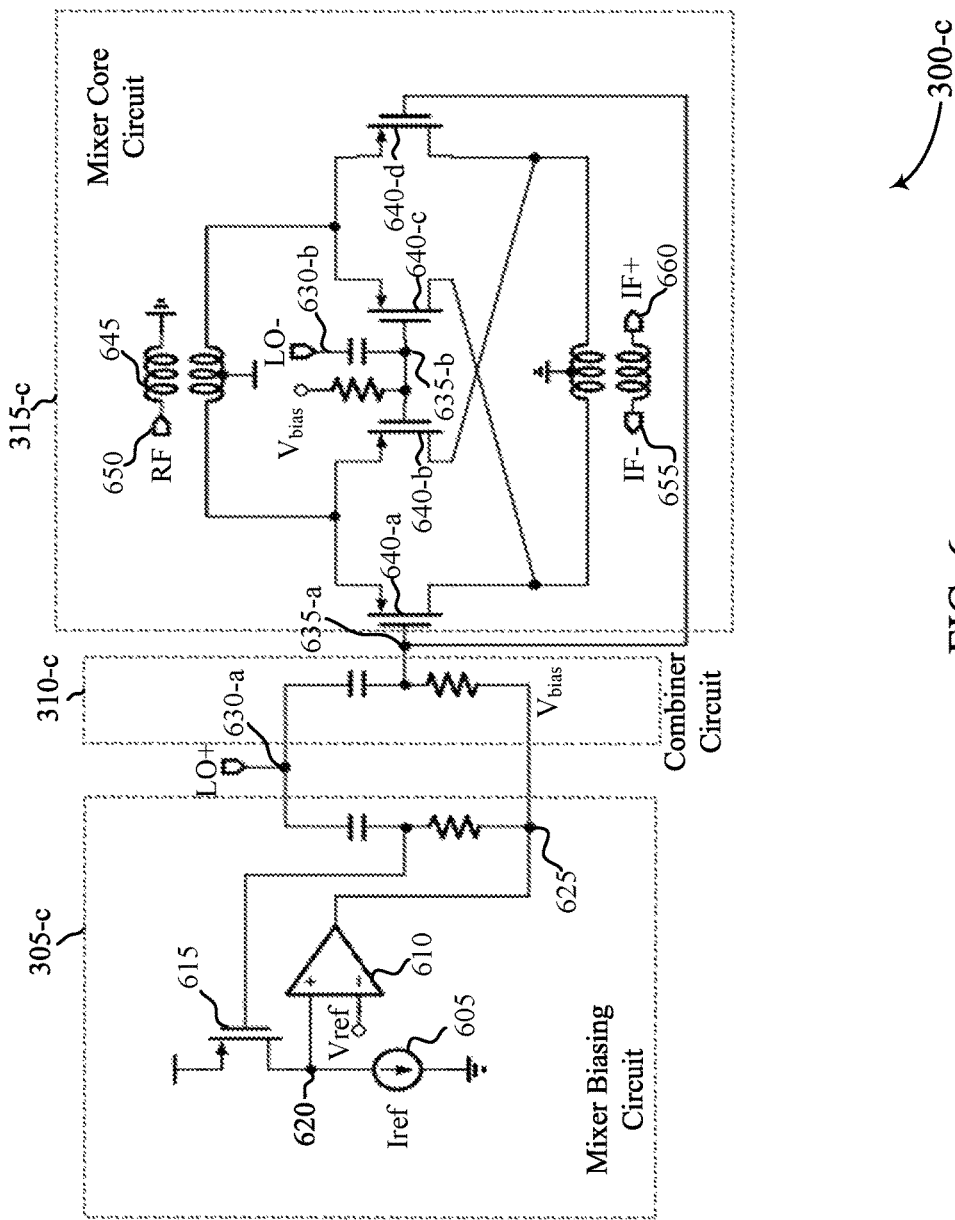
FIG. 6 illustrates an example circuit diagram that supports techniques for enhanced broadband operation of an active mixer in accordance with aspects of the present disclosure.

FIG. 6 illustrates an example circuit diagram 300-*c* for enhanced broadband operation of an active mixer. Depicted are circuit elements of a mixer biasing circuit 305-*c*, a combiner circuit 310-*c*, and a voltage-biased mixer core circuit 315-*c*, which respectively are examples of the mixer biasing circuit 305, the combiner circuit 310, and the voltage-biased mixer core circuit 315 of FIG. 3.

The mixer biasing circuit 305-*c* may include a current source 605, a differential amplifier 610, and a transconductance circuit 615. The transconductance circuit 615 may be comprised of one or more p-channel MOSFETs (PMOS). The drain of the PMOS of the transconductance circuit 615 may be electrically connected to the current source 605 and the non-inverting input of the differential amplifier 610. In some examples, the differential amplifier 610 may be an operational amplifier, a single-stage operational transconductance amplifier (OTA), or the like. The differential amplifier 610 may have a first input to receive a reference voltage (Vref) and a second input to receive a voltage at node 620 for comparison to Vref. The first input of the differential amplifier 610 may be the inverting input and the second input may be the non-inverting input. The differential amplifier 610 may generate, at node 625, the bias voltage Vbias based at least in part on a difference between the voltage Vref and the voltage at node 620.

The combiner circuit 310-*c* may be electrically coupled to node 625 to receive Vbias and to node 630-*a* to receive an LO signal. In the depicted example, the LO signal 320 may be differentially input with LO+ at node 630-*a* and LO− at node 630-*b*, each representing the differential inputs. The LO signal may be a sine wave or other alternating current signal. The combiner circuit 310-*c* may output a biased LO signal at node 635-*a* to one or more switch circuits of the voltage-biased mixer core circuit 315-*c*. Node 635-*a* may be electrically coupled to inputs PMOSs 640-*a* and 640-*d*, and node 630-*b* may be electrically coupled to inputs of PMOSs 640-*b* and 640-*c*. The biased LO signal may be a composite of the DC voltage Vbias and the AC LO signal.

The voltage-biased mixer core circuit 315-*c* shown in FIG. 6 is in a double-balanced active mixer arrangement having a transformer 645 with a node 650 for an input signal (e.g., a RF signal), and differential nodes 655 and 660 for output of a differential output signal (e.g., intermediate frequency signals IF+ and IF−). The RF signal may be within a mm-wave frequency band. For downconversion, voltage-biased mixer core circuit 315-*c* may receive an RF input signal at node 650 and output a downconverted signal at nodes 655 and 660. For upconversion, voltage-biased mixer core circuit 315-*c* may receive an intermediate frequency input signal at node 650 and output an RF signal at nodes 655 and 660.

In this configuration, in order to maintain a constant total DC bias current generated in voltage-biased mixer core circuit 315-*c*, Vbias may have a direct relationship with the LO signal amplitude that scales with changes in the LO signal amplitude. In an example, Vbias may increase when the LO signal amplitude increases, and decrease when LO signal amplitude decreases. Thus, the DC voltage Vbias of the biased LO signal input at node 635 at the PMOSs 640-*a*, 640-*b*, 640-*c*, and 640-*d* of the voltage-biased mixer core circuit 315-*c* may cause these PMOSs to operate at a DC current through transformer 645 that is independent of the amplitude of the LO signal. Beneficially, the DC electrical current generated in the voltage-biased mixer core circuit 315-*c* is substantially independent of the amplitude of the LO signal, thereby enabling the voltage-biased mixer core circuit 315-*c* to simultaneously provide constant gain and improved linearity across a range of mm-wave frequencies.

Figure 7A:
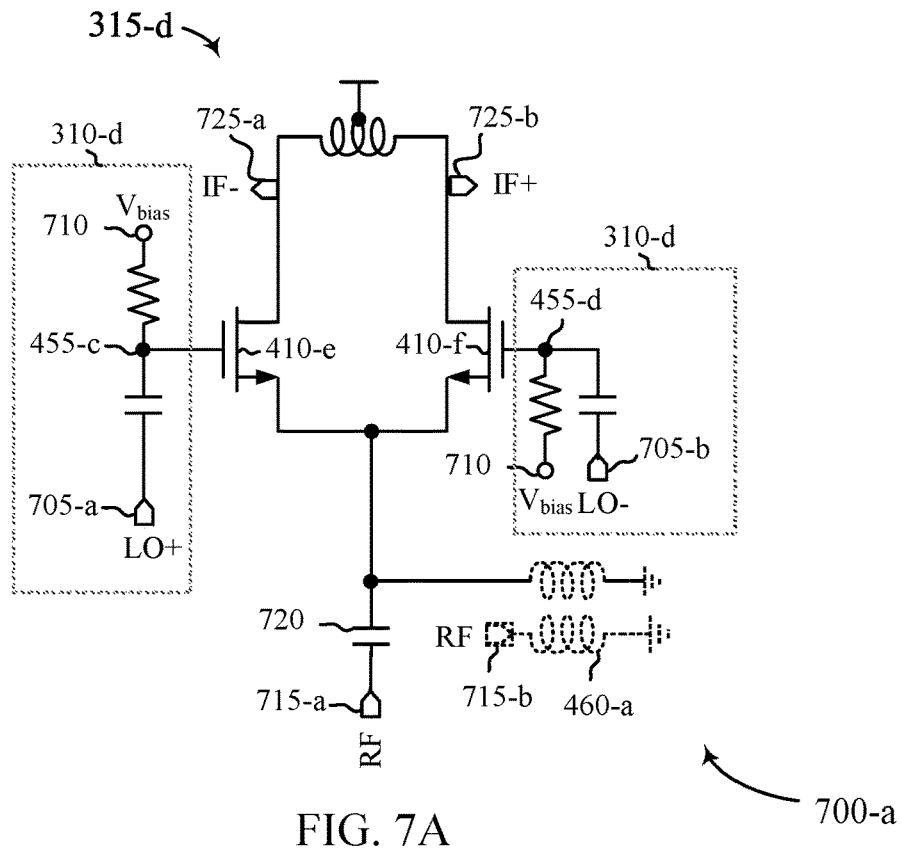
FIGS. 7A-7B illustrate example circuit arrangements that support techniques for enhanced broadband operation of an active mixer in accordance with aspects of the present disclosure.
Figure 7B:
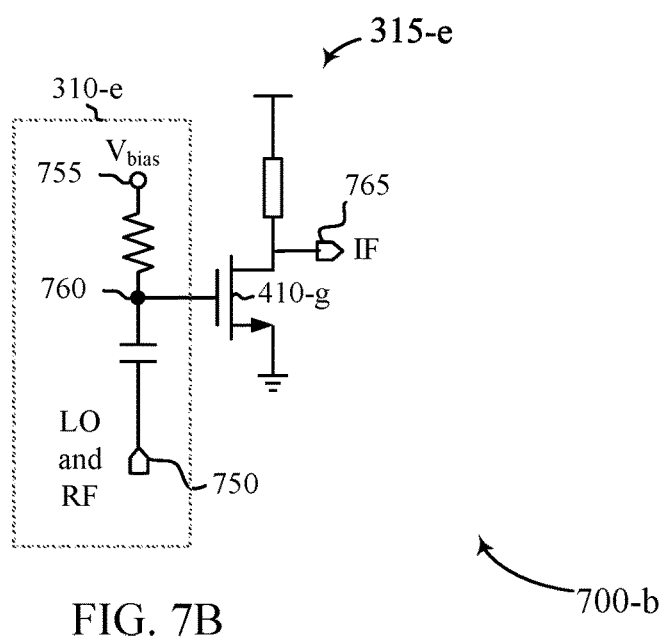

The voltage-biased mixer core circuit 315 may be configured in other arrangements and achieve these same benefits. FIGS. 7A-7B illustrate example circuit arrangements 700-*a* and 700-*b* for enhanced broadband operation of an active mixer. In FIG. 7A, voltage-biased mixer core circuit 315-*d* may be a single-balanced active mixer that differentially receives the LO signal. In FIG. 7B, voltage-biased mixer core circuit 315-*e* may be in a single-transistor active mixer arrangement. In each of FIGS. 7A and 7B, a mixer biasing circuit 305, similar to that shown in FIGS. 4 and 5, may be included but is not shown. In each of FIGS. 7A and 7B, the combiner circuits 310-*d* and 310-*e* include the circuit elements within the dashed boxes, and the voltage-biased mixer core circuits 315-*d* and 315-*e* include the circuit elements not included in the dashed boxes.

With reference to FIG. 7A, a combiner circuit 310-*d* may include nodes 705-*a* and 705-*b* for receiving differential inputs of the LO signal, and node 710 for receiving the bias voltage Vbias output by the mixer biasing circuit 305. The combiner circuit 310-*d* may generate a biased LO signal for input to the voltage-biased mixer core circuit 315-*d* at node 455-*c* and node 455-*d*. In this example, an input signal, such as an input RF signal for downconversion, may be input to the voltage-biased mixer core circuit 315-*d* using one of nodes 715-*a* or 715-*b*. The node 715-*b* is shown in phantom, and transformer 460-*a* also shown in phantom, are optional and both may be removed from the voltage-biased mixer core circuit 315-*d*. In that arrangement, an input signal (e.g., a RF signal for downconversion or an IF signal for upconversion) may be received at node 715-*a* which is electrically coupled to switch circuits 410-*e* and 410-*f* via capacitor 720. In another arrangement, the node 715-*a* and associated capacitor 720 may be removed from the voltage-biased mixer core circuit 315-*d*, and an input may be received at node 715-*b*. The voltage-biased mixer core circuit 315-*d* may include differential nodes 725-*a* and 725-*b* for respectively outputting an output signal, such as an intermediate frequency signal IF− and IF+. In another example, the input signal at node 715-*a* or 715-*b* may be an intermediate frequency signal and the output signal may be a radio frequency signal output at nodes 725-*a* and 725-*b*.

With reference to FIG. 7B, a combiner circuit 310-*e* may include node 750 for a combined LO and input signal (depicted as a RF signal), and node 755 for receiving the bias voltage Vbias output by the mixer biasing circuit 305. The combiner circuit 310-*e* may generate a biased LO signal for input to the voltage-biased mixer core circuit 315-*e* at node 760 of switch circuit 410-*g*. The voltage-biased mixer core circuit 315-*e* may include node 765 for outputting the output signal (e.g., IF signal during downconversion, RF signal during upconversion). In this example, the biased LO signal may generate DC electrical current through switch circuit 410-g that is substantially independent of the amplitude of the input LO signal.

Beneficially, an active mixer that includes the voltage-biased mixer core circuit 315, in combination with the mixer biasing circuit 305 and the combiner circuit 310, may provide substantially consistent gain and linearity and be substantially independent of the amplitude of the LO signal.

Figure 8:
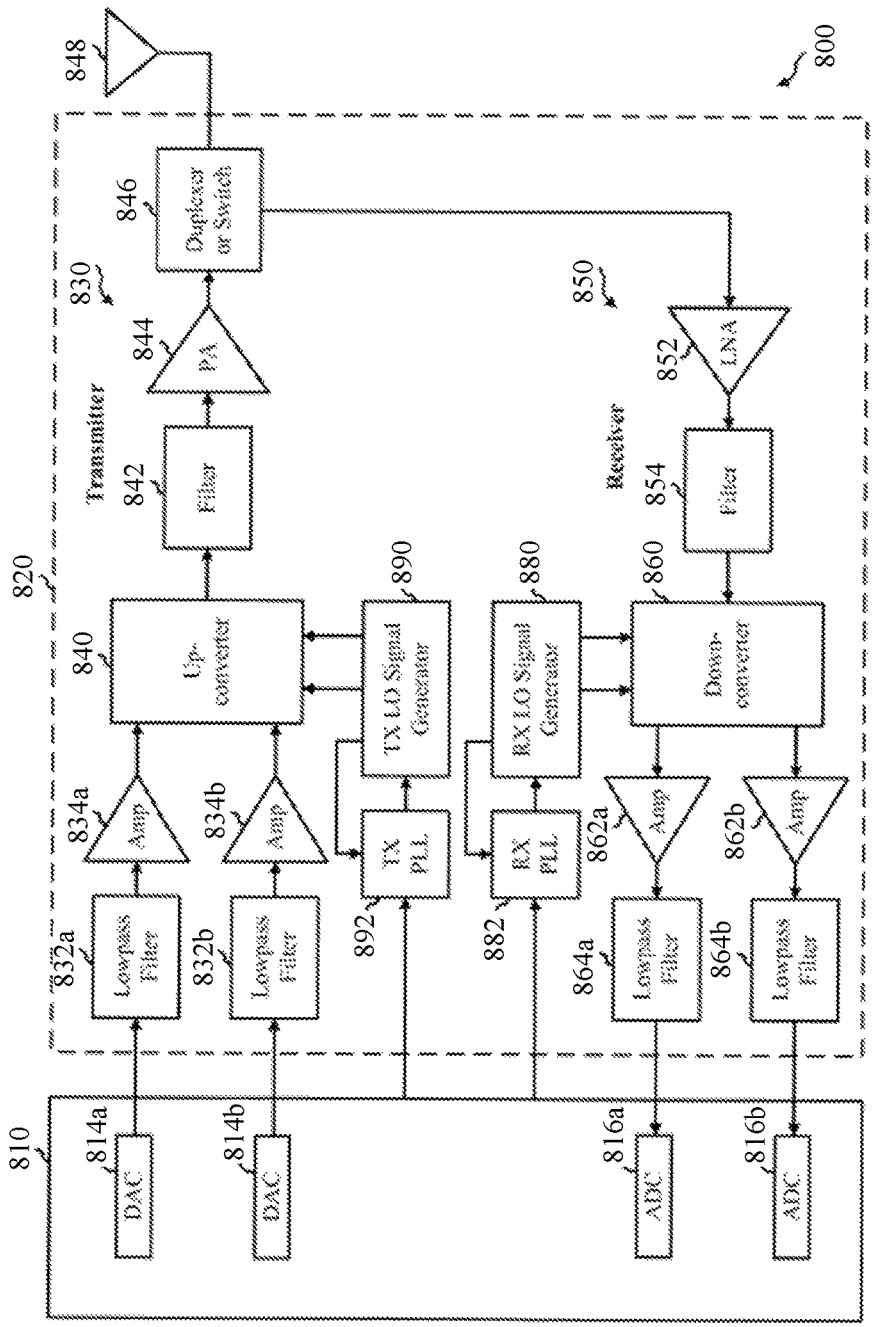
FIG. 8 illustrates an example block diagram of a wireless communication device that supports techniques for enhanced broadband operation of an active mixer in accordance with aspects of the present disclosure.

FIG. 8 illustrates an example block diagram of a wireless communication device 800 for enhanced broadband operation of an active mixer. In general, signals in a transmitter and a receiver may be generated and conditioned by one or more stages of amplifier, filter, upconverter, downconverter, etc. These circuit blocks may be arranged differently from the configuration shown in FIG. 8. Furthermore, other circuit blocks not shown in FIG. 8 may also be used to generate and condition the signals in the transmitter and receiver. Some circuit blocks in FIG. 8 may also be omitted.

In the design shown in FIG. 8, wireless device 800 includes a transceiver 820 and a data processor 810. The data processor 810 may include a memory (not shown) to store data and program codes. Transceiver 820 includes a transmitter 830 and a receiver 850 that support bi-directional communication. In general, wireless device 800 may include any number of transmitters and any number of receivers for any number of communication systems and frequency bands. All or a portion of transceiver 820 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 8, transmitter 830 and receiver 850 are implemented with the direct-conversion architecture.

In the transmit path, data processor 810 processes data to be transmitted and provides I and Q analog output signals to transmitter 830. In the exemplary embodiment shown, the data processor 810 includes digital-to-analog-converters (DAC's) 814a and 814b for converting digital signals generated by the data processor 810 into the I and Q analog output signals, e.g., I and Q output currents, for further processing.

Within transmitter 830, lowpass filters 832a and 832b filter the I and Q analog output signals, respectively, to remove undesired images caused by the prior digital-to-analog conversion. Amplifiers (Amp) 834a and 834b amplify the signals from lowpass filters 832a and 832b, respectively, and provide I and Q baseband signals. An upconverter 840 may include the mixer biasing circuit 305, the combiner circuit 310, and the voltage-biased mixer core circuit 315 as described above. The upconverter 840 may upconvert the I and Q baseband signals with I and Q transmit (TX) local oscillating (LO) signals from a TX LO signal generator 890 and provides an upconverted signal. A filter 842 filters the upconverted signal to remove undesired images caused by the frequency upconversion as well as noise in a receive frequency band. A power amplifier (PA) 844 amplifies the signal from filter 842 to obtain the desired output power level and provides a transmit RF signal. The transmit RF signal is routed through a duplexer or switch 846 and transmitted via an antenna 848.

In the receive path, antenna 848 receives signals transmitted by base stations and provides a received RF signal, which is routed through duplexer or switch 846 and provided to a low noise amplifier (LNA) 852. The received RF signal is amplified by LNA 852 and filtered by a filter 854 to obtain a desirable RF input signal. A downconverter 860 may include the mixer biasing circuit 305, the combiner circuit 310, and the mixer core circuit 315 as described above. The downconverter 860 may downconvert the RF input signal with I and Q receive (RX) LO signals from an RX LO signal generator 880 and provide I and Q baseband signals. The I and Q baseband signals are amplified by amplifiers 862a and 862b and further filtered by lowpass filters 864a and 864b to obtain I and Q analog input signals, which are provided to data processor 810. In the exemplary embodiment shown, the data processor 810 includes analog-to-digital-converters (ADC's) 816a and 816b for converting the analog input signals into digital signals to be further processed by the data processor.

TX LO signal generator 890 generates the I and Q TX LO signals used for frequency upconversion. RX LO signal generator 880 generates the I and Q RX LO signals used for frequency downconversion. Each LO signal is a periodic signal with a particular fundamental frequency. A PLL 892 receives timing information from data processor 810 and generates a control signal used to adjust the frequency and/or phase of the TX LO signals from LO signal generator 890. Similarly, a PLL 882 receives timing information from data processor 810 and generates a control signal used to adjust the frequency and/or phase of the RX LO signals from LO signal generator 880.

Figure 9:
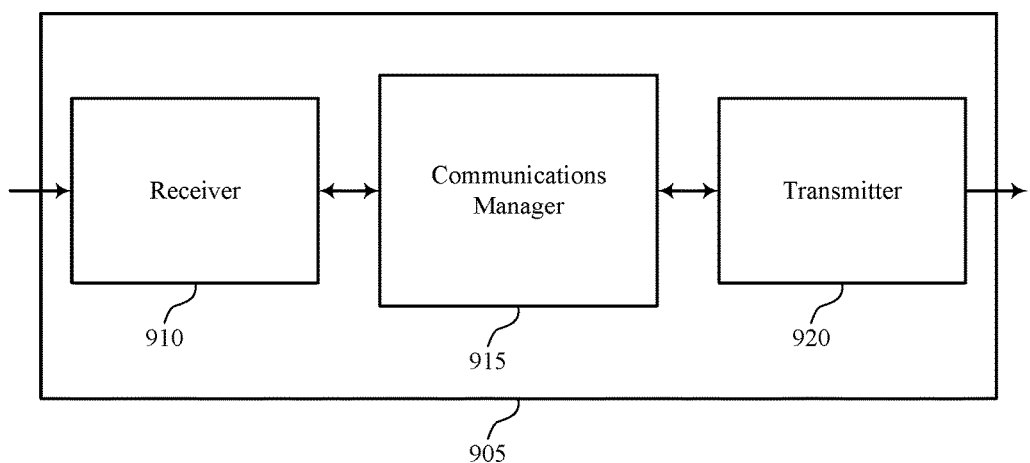
FIGS. 9 through 11 show block diagrams of a device that supports techniques for enhanced broadband operation of an active mixer in accordance with aspects of the present disclosure.

FIG. 9 shows a block diagram 900 of a wireless device 905 that supports techniques for enhanced broadband operation of an active mixer in accordance with various aspects of the present disclosure. Wireless device 905 may be an example of aspects of a user equipment (UE) 115 or base station 105 as described with reference to FIG. 1. Wireless device 905 may include receiver 910, communications manager 915, and transmitter 920. Wireless device 905 may also include a processor. Each of these components may be in communication with one another (e.g., via one or more buses).

Receiver 910 may receive information such as packets, user data, or control information associated with various information channels (e.g., control channels, data channels, and information related to enhanced broadband operation of an active mixer, etc.). Information may be passed on to other components of the device. The receiver 910 may be an example of aspects of the transceiver 1235 described with reference to FIG. 12.

Communications manager 915 may be an example of aspects of the communications manager 1215 described with reference to FIG. 12.

Communications manager 915 and/or at least some of its various sub-components may be implemented in hardware, software executed by a processor, firmware, or any combination thereof. If implemented in software executed by a processor, the functions of the communications manager 915 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The communications manager 915 and/or at least some of its various sub-components may be physically located at various positions, including being distributed such that portions of functions are implemented at different physical locations by one or more physical devices. In some examples, communications manager 915 and/or at least some of its various sub-components may be a separate and distinct component in accordance with various aspects of the present disclosure. In other examples, communications manager 915 and/or at least some of its various sub-components may be combined with one or more other hardware components, including but not limited to a receiver, a transmitter, a transceiver, one or more other components described in the present disclosure, or a combination thereof in accordance with various aspects of the present disclosure.

Communications manager 915 may generate a bias voltage with a magnitude that depends at least in part to an amplitude of an alternating current (AC) local oscillator (LO) signal, generate a direct current (DC) current within an active mixer, where the generated DC current is dependent on the bias voltage and the AC LO signal, and convert, by the active mixer, a signal between a radio frequency and an intermediate frequency based on the AC LO signal.

Transmitter 920 may transmit signals generated by other components of the device. In some examples, the transmitter 920 may be collocated with a receiver 910 in a transceiver module. For example, the transmitter 920 may be an example of aspects of the transceiver 1235 described with reference to FIG. 12. The transmitter 920 may include a single antenna, or it may include a set of antennas.

Figure 10:
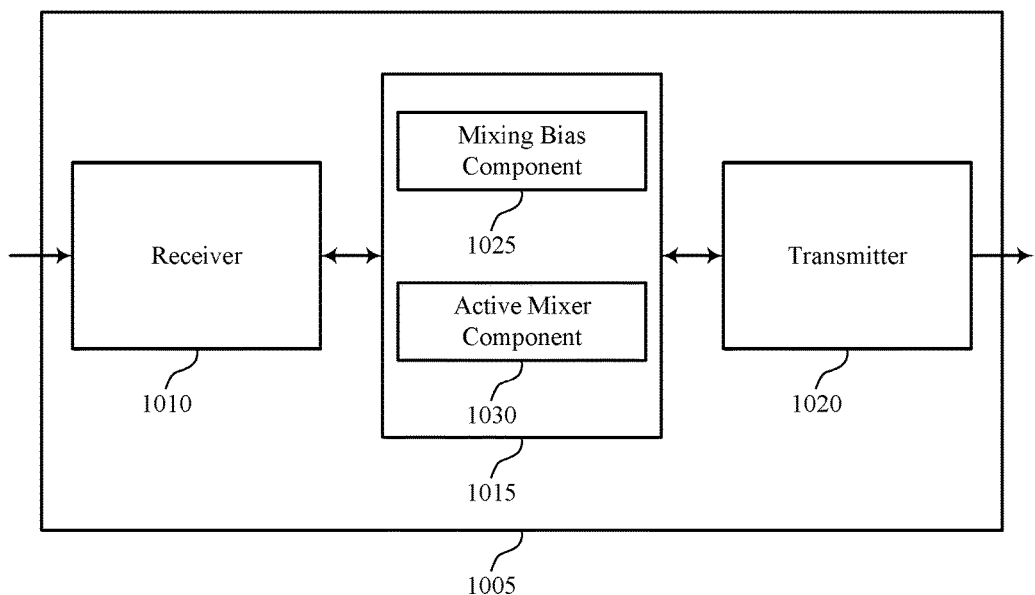

FIG. 10 shows a block diagram 1000 of a wireless device 1005 that supports techniques for enhanced broadband operation of an active mixer in accordance with various aspects of the present disclosure. Wireless device 1005 may be an example of aspects of a wireless device 905 or a UE 115 or base station 105 as described with reference to FIGS. 1 and 9. Wireless device 1005 may include receiver 1010, communications manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to enhanced broadband operation of an active mixer, etc.). Information may be passed on to other components of the device. The receiver 1010 may be an example of aspects of the transceiver 1235 described with reference to FIG. 12.

Communications manager 1015 may be an example of aspects of the communications manager 1215 described with reference to FIG. 12. Communications manager 1015 may also include Mixer Biasing Component 1025 and Active Mixer Component 1030.

Mixer Biasing Component 1025 may generate a bias voltage with a magnitude that has an inverse relationship to an amplitude of an alternating current (AC) local oscillator (LO) signal and inversely control the magnitude of the bias voltage based on the amplitude of the AC LO signal. Mixer Biasing Component 1025 may also generate a bias voltage with a magnitude that depends at least in part on an amplitude of an AC LO signal and control the magnitude of the bias voltage based at least in part on a direct relationship with the amplitude of the AC LO signal.

Active Mixer Component 1030 may generate a direct current (DC) current within an active mixer, where the generated DC current is dependent on the bias voltage and the AC LO signal, and convert, by the active mixer, a signal between a radio frequency and an intermediate frequency based on the AC LO signal. In some cases, converting the signal between the radio frequency and the intermediate frequency includes: upconverting the signal from the intermediate frequency to the radio frequency. In some cases, converting the signal between the radio frequency and the intermediate frequency includes: downconverting the signal from the radio frequency to the intermediate frequency.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1235 described with reference to FIG. 12. The transmitter 1020 may include a single antenna, or it may include a set of antennas.

Figure 11:
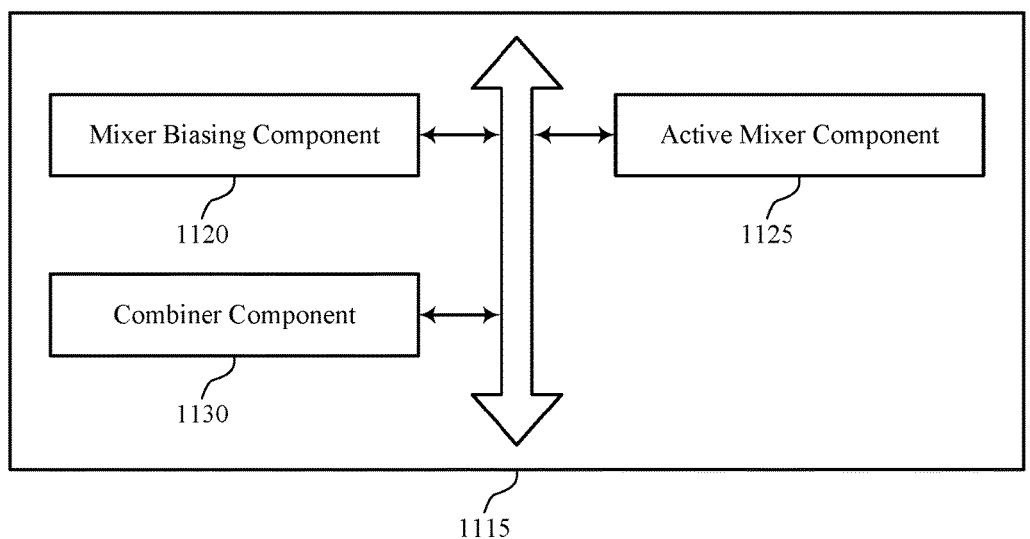

FIG. 11 shows a block diagram 1100 of a communications manager 1115 that supports techniques for enhanced broadband operation of an active mixer in accordance with various aspects of the present disclosure. The communications manager 1115 may be an example of aspects of a communications manager 915, a communications manager 1015, or a communications manager 1215 described with reference to FIGS. 9, 10, and 12. The communications manager 1115 may include Mixer Biasing Component 1120, Active Mixer Component 1125, and Combiner Component 1130. Each of these modules may communicate, directly or indirectly, with one another (e.g., via one or more buses).

Mixer Biasing Component 1120 may generate a bias voltage with a magnitude that has an inverse relationship to an amplitude of an alternating current (AC) local oscillator (LO) signal and inversely control the magnitude of the bias voltage based on the amplitude of the AC LO signal. Mixer Biasing Component 1120 may also generate a bias voltage with a magnitude that depends at least in part on an amplitude of an AC LO signal and control the magnitude of the bias voltage based at least in part on a direct relationship with the amplitude of the AC LO signal.

Active Mixer Component 1125 may generate a direct current (DC) current within an active mixer, where the generated DC current is dependent on the bias voltage and the AC LO signal and convert, by the active mixer, a signal between a radio frequency and an intermediate frequency based on the AC LO signal. In some cases, converting the signal between the radio frequency and the intermediate frequency includes: upconverting the signal from the intermediate frequency to the radio frequency. In some cases, converting the signal between the radio frequency and the intermediate frequency includes: downconverting the signal from the radio frequency to the intermediate frequency.

Combiner Component 1130 may generate a biased LO signal for input to the Active Mixer Component 1125, the biased LO signal being a composite of the bias voltage and the AC LO signal.

Figure 12:
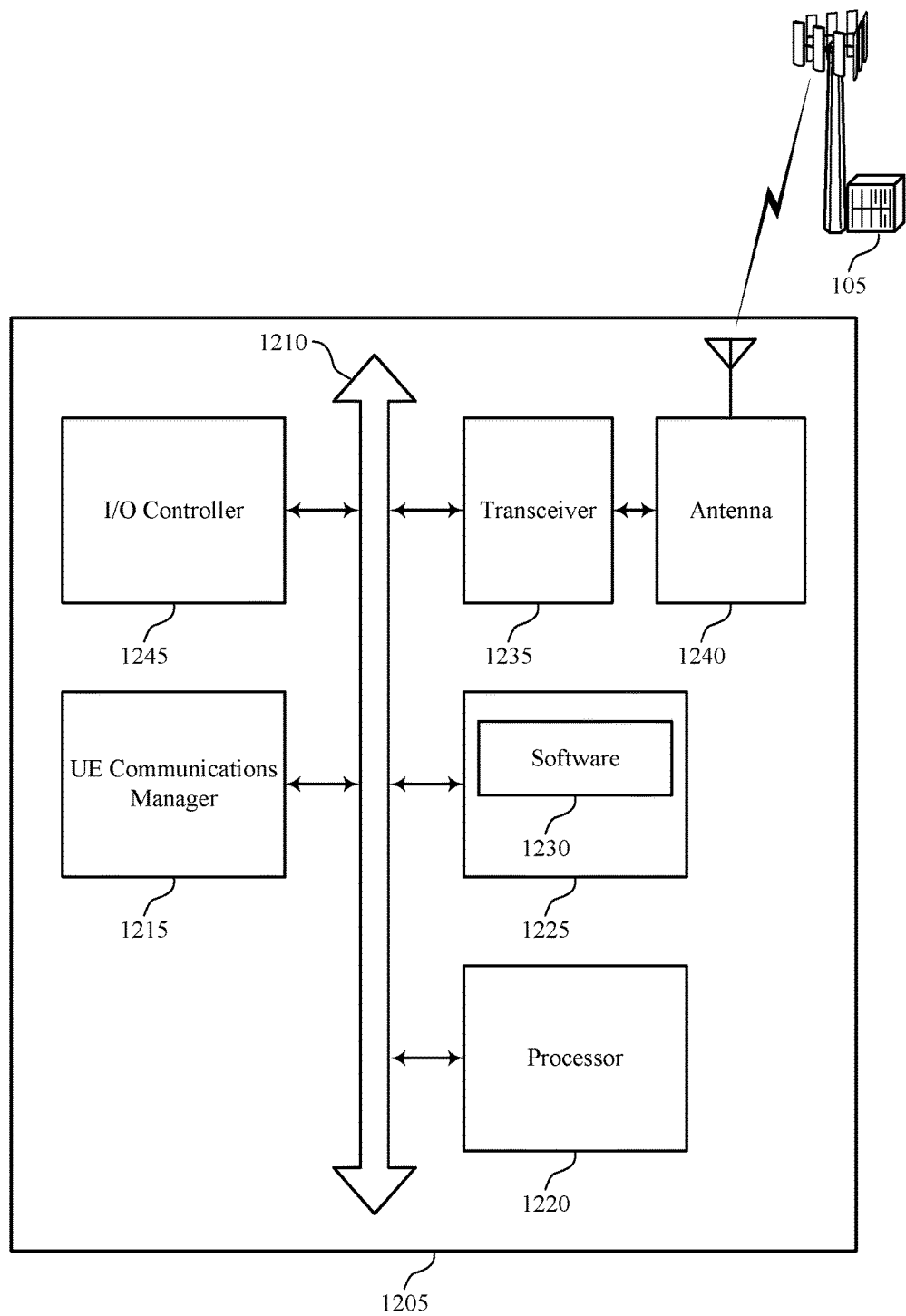
FIG. 12 illustrates a block diagram of a system including a UE that supports techniques for enhanced broadband operation of an active mixer in accordance with aspects of the present disclosure.

FIG. 12 shows a diagram of a system 1200 including a device 1205 that supports techniques for enhanced broadband operation of an active mixer in accordance with various aspects of the present disclosure. Device 1205 may be an example of or include the components of wireless device 905, wireless device 1005, or a UE 115 as described above, e.g., with reference to FIGS. 1, 9 and 10. Device 1205 may include components for bi-directional voice and data communications including components for transmitting and receiving communications, including UE communications manager 1215, processor 1220, memory 1225, software 1230, transceiver 1235, antenna 1240, and I/O controller 1245. These components may be in electronic communication via one or more busses (e.g., bus 1210). Device 1205 may communicate wirelessly with one or more base stations 105.

Processor 1220 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1220 may be configured to operate a memory array using a memory controller. In other cases, a memory controller may be integrated into processor 1220. Processor 1220 may be configured to execute computer-readable instructions stored in a memory to perform various functions (e.g., functions or tasks supporting enhanced broadband operation of an active mixer).

Memory 1225 may include random access memory (RAM) and read only memory (ROM). The memory 1225 may store computer-readable, computer-executable software 1230 including instructions that, when executed, cause the processor to perform various functions described herein. In some cases, the memory 1225 may contain, among other things, a basic input/output system (BIOS) which may control basic hardware and/or software operation such as the interaction with peripheral components or devices.

Software 1230 may include code to implement aspects of the present disclosure, including code to support enhanced broadband operation of an active mixer. Software 1230 may be stored in a non-transitory computer-readable medium such as system memory or other memory. In some cases, the software 1230 may not be directly executable by the processor but may cause a computer (e.g., when compiled and executed) to perform functions described herein.

Transceiver 1235 may communicate bi-directionally, via one or more antennas, wired, or wireless links as described above. For example, the transceiver 1235 may represent a wireless transceiver and may communicate bi-directionally with another wireless transceiver. The transceiver 1235 may also include a modem to modulate the packets and provide the modulated packets to the antennas for transmission, and to demodulate packets received from the antennas.

In some cases, the wireless device may include a single antenna 1240. However, in some cases the device may have more than one antenna 1240, which may be capable of concurrently transmitting or receiving multiple wireless transmissions.

I/O controller 1245 may manage input and output signals for device 1205. I/O controller 1245 may also manage peripherals not integrated into device 1205. In some cases, I/O controller 1245 may represent a physical connection or port to an external peripheral. In some cases, I/O controller 1245 may utilize an operating system such as iOS®, ANDROID®, MS-DOS®, MS-WINDOWS®, OS/2®, UNIX®, LINUX®, or another known operating system.

Figure 13:
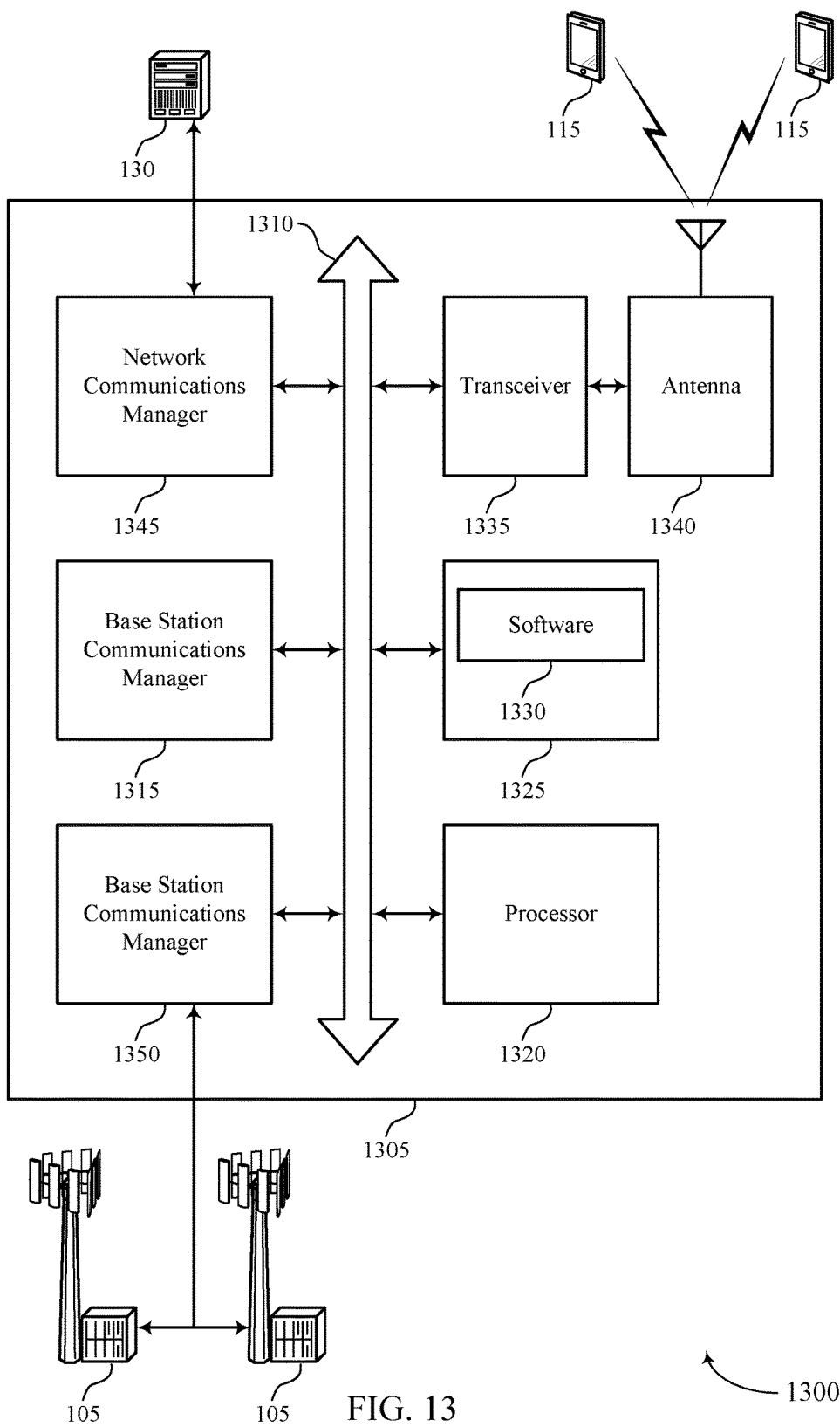
FIG. 13 illustrates a block diagram of a system including a base station that supports techniques for enhanced broadband operation of an active mixer in accordance with aspects of the present disclosure.

FIG. 13 shows a diagram of a system 1300 including a device 1305 that supports techniques for enhanced broadband operation of an active mixer in accordance with various aspects of the present disclosure. Device 1305 may be an example of or include the components of wireless device 1005, wireless device 1105, or a base station 105 as described above, e.g., with reference to FIGS. 1, 10 and 11. Device 1305 may include components for bi-directional voice and data communications including components for transmitting and receiving communications, including base station communications manager 1315, processor 1320, memory 1325, software 1330, transceiver 1335, antenna 1340, network communications manager 1345, and base station communications manager 1350. These components may be in electronic communication via one or more busses (e.g., bus 1310). Device 1305 may communicate wirelessly with one or more UEs 115.

Base station communications manager 1315 may manage communications with other base station 105, and may include a controller or scheduler for controlling communications with UEs 115 in cooperation with other base stations 105. For example, the base station communications manager 1315 may coordinate scheduling for transmissions to UEs 115 for various interference mitigation techniques such as beamforming or joint transmission. In some examples, base station communications manager 1315 may provide an X2 interface within an Long Term Evolution (LTE)/LTE-A wireless communication network technology to provide communication between base stations 105.

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting enhanced broadband operation of an active mixer).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware and/or software operation such as the interaction with peripheral components or devices.

Software 1330 may include code to implement aspects of the present disclosure, including code to support enhanced broadband operation of an active mixer. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In some cases, the wireless device may include a single antenna 1340. However, in some cases the device may have more than one antenna 1340, which may be capable of concurrently transmitting or receiving multiple wireless transmissions.

Network communications manager 1345 may manage communications with the core network (e.g., via one or more wired backhaul links). For example, the network communications manager 1345 may manage the transfer of data communications for client devices, such as one or more UEs 115.

Base station communications manager 1350 may manage communications with other base station 105, and may include a controller or scheduler for controlling communications with UEs 115 in cooperation with other base stations 105. For example, the base station communications manager 1350 may coordinate scheduling for transmissions to UEs 115 for various interference mitigation techniques such as beamforming or joint transmission. In some examples, base station communications manager 1350 may provide an X2 interface within an LTE/LTE-A wireless communication network technology to provide communication between base stations 105.

Figure 14:
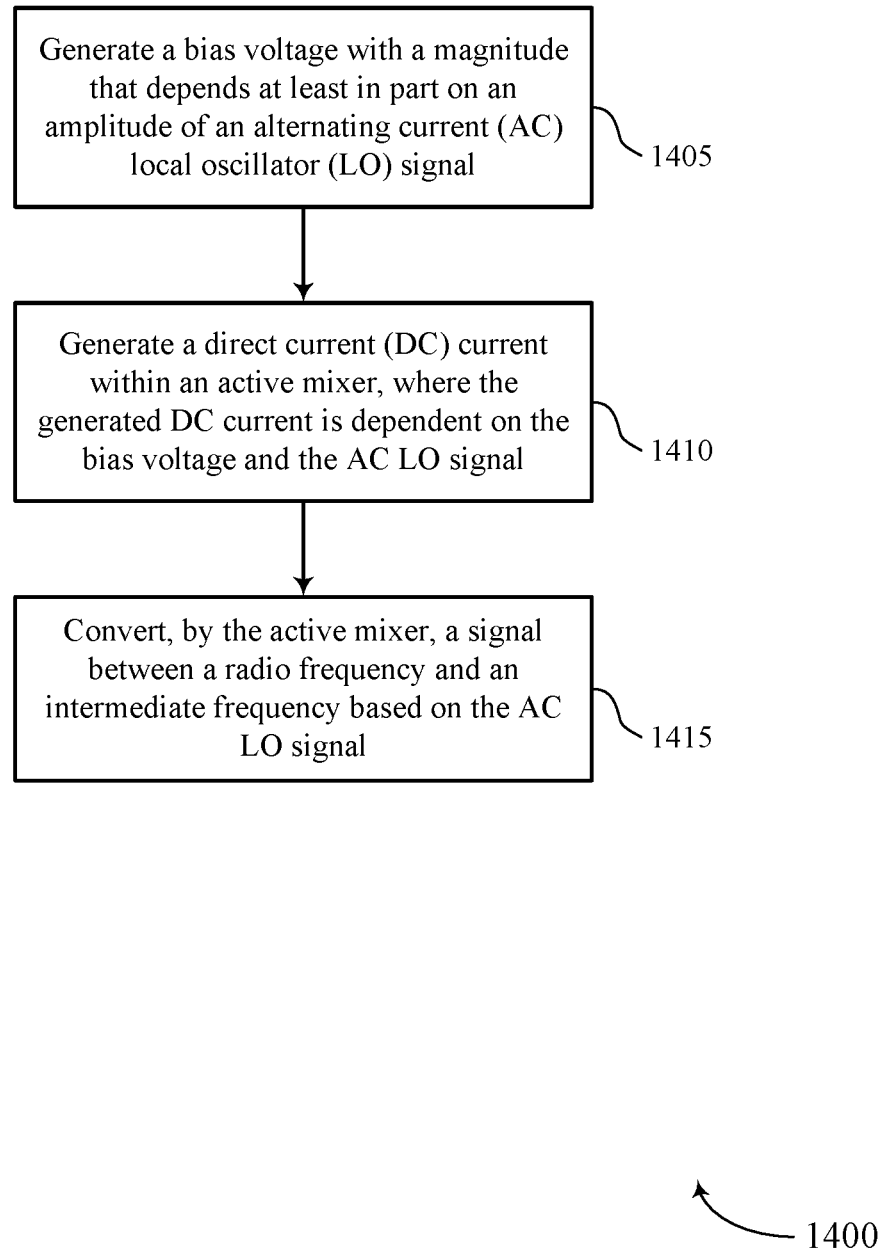
FIGS. 14 and 15 illustrate methods for techniques for enhanced broadband operation of an active mixer in accordance with aspects of the present disclosure.

FIG. 14 shows a flowchart illustrating a method 1400 for enhanced broadband operation of an active mixer in accordance with various aspects of the present disclosure. The operations of method 1400 may be implemented by a UE 115 or base station 105 or its components as described herein. For example, the operations of method 1400 may be performed by a communications manager as described with reference to FIGS. 9 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1405 the UE 115 or base station 105 may generate a bias voltage with a magnitude that depends at least in part on an amplitude of an alternating current (AC) local oscillator (LO) signal. The operations of block 1405 may be performed according to the methods described with reference to FIGS. 1 through 8. In certain examples, aspects of the operations of block 1405 may be performed by a Mixer Biasing Component as described with reference to FIGS. 9 through 11.

At block 1410 the UE 115 or base station 105 may generate a direct current (DC) current within an active mixer, wherein the generated DC current is dependent on the bias voltage and the AC LO signal. In some examples, a biasing circuit generates a bias voltage that has an inverse relationship to an amplitude of the LO signal. In an inverse relationship, the biasing circuit may increase the bias voltage when the amplitude of the LO signal decreases and decrease the bias voltage when the amplitude of the LO signal increases. In other examples, the biasing circuit may generate a bias voltage that has a direct relationship with the amplitude of the LO signal. In a direct relationship, the biasing circuit may increase the bias voltage when the amplitude of the LO signal increases and decrease the bias voltage when the amplitude of the LO signal decreases. The operations of block 1410 may be performed according to the methods described with reference to FIGS. 1 through 8. In certain examples, aspects of the operations of block 1410 may be performed by an Active Mixer Component as described with reference to FIGS. 9 through 11.

At block 1415 the UE 115 or base station 105 may convert, by the active mixer, a signal between a radio frequency and an intermediate frequency based at least in part on the AC LO signal. The operations of block 1415 may be performed according to the methods described with reference to FIGS. 1 through 8. In certain examples, aspects of the operations of block 1415 may be performed by an Active Mixer Component as described with reference to FIGS. 9 through 11.

Figure 15:
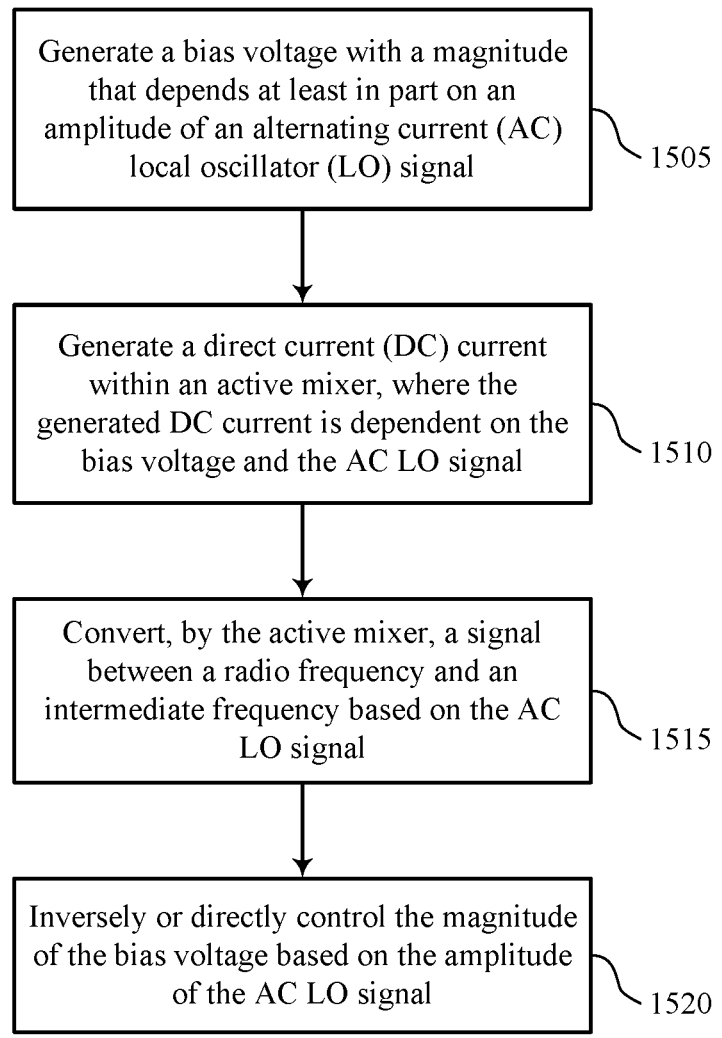

FIG. 15 shows a flowchart illustrating a method 1500 for enhanced broadband operation of an active mixer in accordance with various aspects of the present disclosure. The operations of method 1500 may be implemented by a UE 115 or base station 105 or its components as described herein. For example, the operations of method 1500 may be performed by a communications manager as described with reference to FIGS. 9 through 11. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1505 the UE 115 or base station 105 may generate a bias voltage with a magnitude that depends at least in part on an amplitude of an alternating current (AC) local oscillator (LO) signal. The operations of block 1505 may be performed according to the methods described with reference to FIGS. 1 through 8. In certain examples, aspects of the operations of block 1505 may be performed by a Mixer Biasing Component as described with reference to FIGS. 9 through 11.

At block 1510 the UE 115 or base station 105 may generate a direct current (DC) current within an active mixer, wherein the generated DC current is dependent on the bias voltage and the AC LO signal. The operations of block 1510 may be performed according to the methods described with reference to FIGS. 1 through 8. In certain examples, aspects of the operations of block 1510 may be performed by an Active Mixer Component as described with reference to FIGS. 9 through 11.

At block 1515 the UE 115 or base station 105 may convert, by the active mixer, a signal between a radio frequency and an intermediate frequency based at least in part on the AC LO signal. The operations of block 1515 may be performed according to the methods described with reference to FIGS. 1 through 8. In certain examples, aspects of the operations of block 1515 may be performed by an Active Mixer Component as described with reference to FIGS. 9 through 11.

At block 1520 the UE 115 or base station 105 may inversely or directly control the magnitude of the bias voltage based at least in part on the amplitude of the AC LO signal. In some examples, a biasing circuit generates a bias voltage that has an inverse relationship to an amplitude of the LO signal. In an inverse relationship, the biasing circuit may increase the bias voltage when the amplitude of the LO signal decreases and decrease the bias voltage when the amplitude of the LO signal increases. In other examples, the biasing circuit may generate a bias voltage that has a direct relationship with the amplitude of the LO signal. In a direct relationship, the biasing circuit may increase the bias voltage when the amplitude of the LO signal increases and decrease the bias voltage when the amplitude of the LO signal decreases. The operations of block 1520 may be performed according to the methods described with reference to FIGS. 1 through 8. In certain examples, aspects of the operations of block 1520 may be performed by a Mixer Biasing Component as described with reference to FIGS. 9 through 11.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are releases of Universal Mobile Telecommunications System (UMTS) that use E-UTRA. UTRA, E-UTRA, UMTS, LTE, LTE-A, NR, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of evolved node B (eNBs) provide coverage for various geographical regions. For example, each eNB, gNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), next generation NodeB (gNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus for wireless communication, comprising:
   an active mixer configured to convert between radio frequency signals and intermediate frequency signals based at least in part on an alternating current local oscillator signal, wherein a direct current generated within the active mixer is dependent in part on a bias voltage and the alternating current local oscillator signal; and
   a mixer biasing circuit configured to generate the bias voltage for the active mixer, a magnitude of the bias voltage depending at least in part on an amplitude of the alternating current local oscillator signal, the mixer biasing circuit comprising a feedback loop configured to inversely control the magnitude of the bias voltage with respect to the amplitude of the alternating current local oscillator signal.

2. The apparatus of claim 1, further comprising:
   a combiner circuit configured to generate a biased local oscillator signal for input to the active mixer, the biased local oscillator signal being a composite of the bias voltage and the alternating current local oscillator signal.

3. The apparatus of claim 2, wherein the mixer biasing circuit further comprises:
   a current source configured to provide a reference electrical current; and
   a transconductance circuit configured to receive the reference electrical current and the alternating current local oscillator signal.

4. The apparatus of claim 3, wherein the mixer biasing circuit further comprises:
   a differential amplifier comprising a first input configured to receive a voltage of the transconductance circuit, a second input configured to receive a reference voltage, and an output configured to output the bias voltage.

5. The apparatus of claim 3, further comprising:
   a differential drive circuit that comprises the transconductance circuit and a second transconductance circuit, the second transconductance circuit configured to receive the reference electrical current, the differential drive circuit configured to respectively receive differential inputs of the alternating current local oscillator signal.

6. The apparatus of claim 2, wherein the mixer biasing circuit further comprises:
   a differential amplifier; and
   a p-channel metal-oxide semiconductor field-effect transistor with a drain electrically connected to a current source and the differential amplifier; and
   wherein the differential amplifier comprises a first input electrically connected to the drain of the p-channel metal-oxide semiconductor field-effect transistor, a second input configured to receive a reference voltage, and an output configured to output the bias voltage.

7. The apparatus or claim 1, wherein the active mixer is selected from the group consisting of a single-balanced active mixer, a double-balanced active mixer, or a single-transistor active mixer.

8. The apparatus of claim 1, wherein the active mixer comprises:
a switch circuit configured to generate the direct current within the active mixer based at least in part on the bias voltage and the alternating current local oscillator signal.

9. The apparatus of claim 1, wherein the alternating current local oscillator signal has a frequency within a defined frequency range, and the amplitude of the alternating current local oscillator signal varies as a function of frequency over the defined frequency range.

10. The apparatus of claim 1, wherein the amplitude of the alternating current local oscillator signal varies based at least in part on temperature, process corners at a specific frequency, or both.

11. The apparatus of claim 1, wherein the active mixer comprises an input configured to receive a signal for upconversion and is configured to upconvert the signal from a first intermediate frequency to a first radio frequency.

12. The apparatus of claim 1, wherein the active mixer comprises an input to receive a signal for downconversion and is configured to downconvert the signal from a first radio frequency to a first intermediate frequency.

13. An apparatus for wireless communication, comprising:
active mixing means for converting between radio frequency signals and intermediate frequency signals based at least in part on an alternating current local oscillator signal, wherein a direct current generated within the active mixing means is dependent in part on a bias voltage and the alternating current local oscillator signal;
mixer biasing means for generating the bias voltage for the active mixing means, a magnitude of the bias voltage depending at least in part on an amplitude of the alternating current local oscillator signal; and
means for inversely controlling the magnitude of the bias voltage with respect to the amplitude of the alternating current local oscillator signal.

14. The apparatus of claim 13, further comprising:
combiner means for generating a biased local oscillator signal for input to the active mixing means, the biased local oscillator signal being a composite of the bias voltage and the alternating current local oscillator signal.

15. The apparatus of claim 13, wherein the active mixer means further comprises:
input means for receiving a signal for upconversion, the active mixer means for upconverting the signal from a first intermediate frequency to a first radio frequency.

16. The apparatus of claim 13, wherein the active mixer means further comprises:
input means for receiving a signal for downconversion, the active mixer means for downconverting the signal from a first radio frequency to a first intermediate frequency.

17. A method for wireless communication, comprising:
generating a bias voltage with a magnitude that depends at least in part on an amplitude of an alternating current local oscillator signal;
generating a direct current within an active mixer, wherein the generated direct current is dependent on the bias voltage and the alternating current local oscillator signal;
converting, by the active mixer, a signal between a radio frequency and an intermediate frequency based at least in part on the alternating current local oscillator signal; and
inversely controlling the magnitude of the bias voltage with respect to the amplitude of the alternating current local oscillator signal.

18. The method of claim 17, wherein converting the signal between the radio frequency and the intermediate frequency comprises:
upconverting the signal from the intermediate frequency to the radio frequency.

19. The method of claim 17, wherein converting the signal between the radio frequency and the intermediate frequency comprises:
downconverting the signal from the radio frequency to the intermediate frequency.

20. An apparatus for wireless communication, comprising:
means for generating a bias voltage with a magnitude that depends at least in part on an amplitude of au alternating current local oscillator signal;
means for generating a direct current within an active mixer, wherein the generated direct current is dependent on the bias voltage and the alternating current local oscillator signal; and
means for converting, by the active mixer, a signal between a radio frequency and an intermediate frequency based at least in part on the alternating current local oscillator signal; and
means for inversely controlling the magnitude of the bias voltage with respect to the amplitude of the alternating current local oscillator sural.

21. The apparatus of claim 18, wherein converting the signal between the radio frequency and the intermediate frequency comprises:
upconverting the signal from the intermediate frequency to the radio frequency.

22. The apparatus of claim 20, wherein converting the signal between the radio frequency and the intermediate frequency comprises:
downconverting the signal from the radio frequency to the intermediate frequency.

* * * * *